(12) United States Patent
Fujimori et al.

(10) Patent No.: US 6,692,884 B2
(45) Date of Patent: Feb. 17, 2004

(54) POSITIVE PHOTORESIST COMPOSITION

(75) Inventors: Toru Fujimori, Shizuoka (JP); Kunihiko Kodama, Shizuoka (JP); Kenichiro Sato, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 113 days.

(21) Appl. No.: 10/116,137

(22) Filed: Apr. 5, 2002

(65) Prior Publication Data

US 2003/0044715 A1 Mar. 6, 2003

(30) Foreign Application Priority Data

Apr. 6, 2001 (JP) .................................. P.2001-108627

(51) Int. Cl.⁷ ............................. G03F 7/004; G03F 7/30
(52) U.S. Cl. .................... 430/170; 430/270.1; 430/905
(58) Field of Search ............................. 430/170, 270.1, 430/905

(56) References Cited

U.S. PATENT DOCUMENTS

| | | | | | |
|---|---|---|---|---|---|
| 6,087,063 A | * | 7/2000 | Hada et al. | ............... | 430/270.1 |
| 6,492,091 B2 | * | 12/2002 | Kodama et al. | ......... | 430/270.1 |
| 6,537,727 B2 | * | 3/2003 | Yoon et al. | ............... | 430/270.1 |
| 6,548,220 B2 | * | 4/2003 | Uetani et al. | ............. | 430/270.1 |
| 6,579,659 B2 | * | 6/2003 | Uetani et al. | ............. | 430/270.1 |

FOREIGN PATENT DOCUMENTS

| JP | 9-73173 | 3/1997 |
|---|---|---|
| JP | 9-90637 | 4/1997 |
| JP | 10-207069 | 8/1998 |
| JP | 10-239846 | 9/1998 |
| JP | 10-274852 | 10/1998 |

* cited by examiner

*Primary Examiner*—John S. Chu
(74) *Attorney, Agent, or Firm*—Sughrue Mion, PLLC

(57) ABSTRACT

A positive photoresist composition comprises: a compound capable of generating an acid upon irradiation with an actinic ray or a radiation, in which the compound contains (A1) a sulfonate compound of a sulfonium, and (A2) a sulfonate compound of an N-hydroxyimide or a disulfonyldiazomethane compound; and a resin capable of decomposing by the action of an acid to increase the solubility in an alkali developing solution, in which the resin contains a repeating unit having a specific lactone structure.

18 Claims, No Drawings

US 6,692,884 B2

POSITIVE PHOTORESIST COMPOSITION

FIELD OF THE INVENTION

The present invention relates to a positive photoresist composition for use in ultra-micro-lithography processes, such as the manufacture of ultra LSI (large-scale integrated circuit) and high capacitance micro chips, and in other photo-fabrication processes.

More specifically, the present invention relates to a positive photoresist composition capable of forming a highly precise pattern using the light in the region of far ultraviolet rays including excimer laser rays, in particular the lights of wavelength of 250 nm or lower.

BACKGROUND OF THE INVENTION

The degree of integration of integrated circuits has been heightened more and more in recent years, and the process of ultra-fine pattern comprising line width of half a micrometer or less has been required in the manufacture of semiconductor substrates, such as ultra LSI. For satisfying the necessity, the wavelengths used in the exposure apparatus for photo-lithography have become short waves more and more, and the use of short wavelength excimer laser rays (XeCl, KrF, ArF, etc.) of far ultraviolet rays has been discussed now.

Chemically amplified resists are used for the pattern formation of lithography in the above wavelength region.

In general, chemical amplification series resist compositions can be roughly classified into three kinds of a two component system, a two and a half component system and a three component system. A two component system comprises a combination of a compound which generates an acid by photo-decomposition (hereinafter referred to as a light-acid generating agent) and a binder resin. The binder resin is a resin having a group which is decomposed by the action of an acid and increases the solubility of the resin in an alkali developer (an acid-decomposable group) in the molecule. A two and a half component system comprises a combination of the above two component system and a low molecular weight compound having an acid-decomposable group. A three component system comprises a light-acid generating agent, an alkali-soluble resin and the above-described low molecular weight compound.

The chemical amplification series resist compositions are suitably used in the photoresist for irradiation with ultraviolet and far ultraviolet rays, but it is further necessary to cope with required characteristics on use. For example, when the light of the wavelength of 248 nm of a KrF excimer laser is used as an exposure light source, a resist composition comprising a hydroxystyrene polymer particularly small in light absorption containing an acetal group or a ketal group as a protective group is proposed. Further, similar compositions containing a t-butoxycarbonyloxy group or a p-tetrahydropyranyloxy group as an acid-separable group are proposed.

Although these resist compositions suit the wavelength of 248 nm of a KrF excimer laser, since the absorbance is substantially too large when an ArF excimer laser is used as a light source, the sensitivity is low. Further, there are other problems coming from the absorbance, e.g., deterioration of definition, deterioration of the tolerance of focus and deterioration of pattern profile, therefore, there is much room for improvement.

As the photoresist composition for an ArF light source, a resin having an alicyclic hydrocarbon moiety for the purpose of imparting dry etching resistance is suggested. As such resins, resins obtained by copolymerizing a monomer having a carboxylic acid moiety, such as an acrylic acid and a methacrylic acid, or a monomer having a hydroxyl group or a cyano group in the molecule, with a monomer having an alicyclic hydrocarbon group are proposed.

On the other hand, a method of providing dry etching resistance by using an alicyclic hydrocarbon moiety as a polymer backbone chain is also discussed besides the method of introducing an alicyclic hydrocarbon moiety to the side chain of an acrylate monomer.

Resist materials comprising an alkali-soluble group protected with a structure containing an alicyclic group, and an acid-sensitive compound containing a structural unit capable of making the alkali-soluble group dissociate by acid to thereby bring into alkali-soluble are disclosed in JP-A-9-73173 (the term "JP-A" as used herein means an "unexamined published Japanese patent application"), JP-A-9-90637, and JP-A-10-161313.

Resins comprising such an alicyclic group containing a hydrophilic 5- or 6-membered lactone group introduced for the purpose of improving the affinity for an alkali developing solution and the adhesion to a substrate are disclosed in JP-A-9-90637, JP-A-10-207069, JP-A-10-274852 and JP-A-10-239846.

Problems attributable to resins having an acid-decomposable group still remain unsolved even by the above techniques in the photoresist composition (in particular, a photoresist for far ultraviolet exposure), and there are many points required to be improved, e.g., a further increase of sensitivity, an improvement of definition, and an improvement of the adhesion with a substrate caused by containing an alicyclic hydrocarbon group in the molecule at the same time.

Further, in recent years, with the requirement of becoming minute more and more of semiconductor chips, the design pattern of the semiconductor has reached the region as fine as 0.13 to 0.35 $\mu$m.

However, various characteristics, such as the reduction of development defects and halftone exposure aptitude, cannot be satisfied by the prior techniques.

The halftone exposure aptitude indicates whether side lobe (a phenomenon that the surface of unexposed area becomes weak and comes to be perforated) which is caused when exposure is performed with a half tone phase shift mask is not caused or difficultly caused.

SUMMARY OF THE INVENTION

Accordingly, an object of the present invention is to provide a positive photoresist composition which is improved in development defect in the production of a semiconductor device and also excellent in halftone exposure aptitude.

As a result of eager investigation of the components of positive chemical amplification resist compositions, the present inventors found that the above object of the present invention could be obtained by using an acid-decomposable resin having a specific lactone structure, which led to the present invention.

That is, the above object of the present invention can be achieved by the following means.

(1) A positive photoresist composition comprising:

(A) a compound capable of generating an acid upon irradiation with one of an actinic ray and a radiation, wherein the compound (A) includes:

(A1) a sulfonate compound of a sulfonium; and (A2) at least one compound of a sulfonate compound of an N-hydroxyimide and a disulfonyldiazomethane compound; and (B) a resin capable of decomposing by the action of an acid to increase the solubility in an alkali developer, wherein the resin (B) contains a repeating unit having a group represented by at least one of formulae (I-1), (I-2), (I-3) and (I-4):

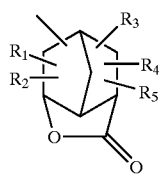
(I-1)

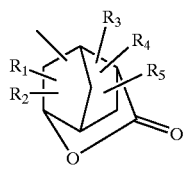
(I-2)

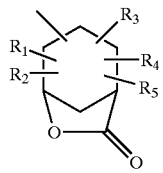
(I-3)

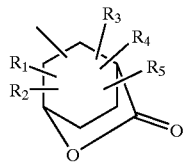
(I-4)

wherein $R_1$, $R_2$, $R_3$, $R_4$ and $R_5$, which may be the same or different, each represents a hydrogen atom, an alkyl group, a cycloalkyl group, or an alkenyl group; and two of $R_1$, $R_2$, $R_3$, $R_4$ and $R_5$ may be bonded to form a ring.

(2) The positive photoresist composition as described in the item (1), wherein the resin (B) further contains a repeating unit having an alkali-soluble group protected by at least one of groups containing an alicyclic hydrocarbon structure, which are represented by formula (pI), (pII), (pIII), (pIV), (pV) or (pVI):

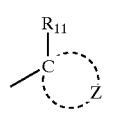
(pI)

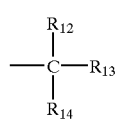
(pII)

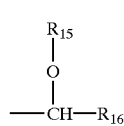
(pIII)

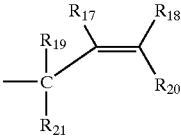
(pIV)

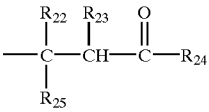
(pV)

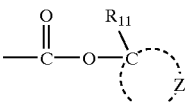
(pVI)

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the carbon atom; $R_{12}$, $R_{13}$, $R_{14}$, $R_{15}$ and $R_{16}$ each represents a straight chain or branched alkyl group having from 1 to 4 carbon atoms, or an alicyclic hydrocarbon group, and at least one of $R_{12}$, $R_{13}$ and $R_{14}$, or at least one of $R_{15}$ and $R_{16}$ represents an alicyclic hydrocarbon group; $R_{17}$, $R_{18}$, $R_{19}$, $R_{20}$ and $R_{21}$ each represents a hydrogen atom, a straight chain or branched alkyl group having from 1 to 4 carbon atoms, or an alicyclic hydrocarbon group, and at least one of $R_{17}$, $R_{18}$, $R_{19}$, $R_{20}$ and $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each represents a straight chain or branched alkyl group having from 1 to 4 carbon atoms, or an alicyclic hydrocarbon group, and at least one of $R_{22}$, $R_{23}$, $R_{24}$ and $R_{25}$ represents an alicyclic hydrocarbon group.

(3) The positive photoresist composition as described in the item (2), wherein the group represented by formulae (pI) to (pVI) is represented by formula (II):

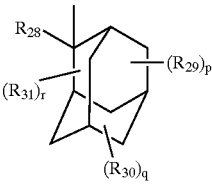
(II)

wherein $R_{28}$ represents an alkyl group; $R_{29}$, $R_{30}$ and $R_{31}$, which may be the same or different, each represents a hydroxyl group, a halogen atom, a carboxyl group, or an alkyl, cycloalkyl, alkenyl, alkoxyl, alkoxycarbonyl or acyl group; p, q and r each represents 0 or an integer of from 1 to 3.

(4) The positive photoresist composition as described in the item (1), wherein the resin (B) further contains a repeating unit represented by formula (a):

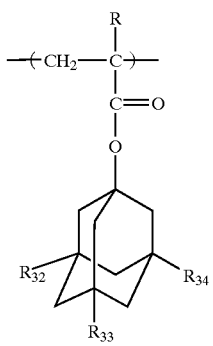
(a)

wherein R represents a hydrogen atom, a halogen atom, or an alkyl group having from 1 to 4 carbon atoms; $R_{32}$, $R_{33}$ and $R_{34}$, which may be the same or different, each represents a hydrogen atom or a hydroxyl group, and at least one of $R_{32}$, $R_{33}$ and $R_{34}$ represents a hydroxyl group.

(5) The positive photoresist composition as described in the item (1), wherein the resin (B) further contains at least one of repeating units represented by formulae (III-a) to (III-d):

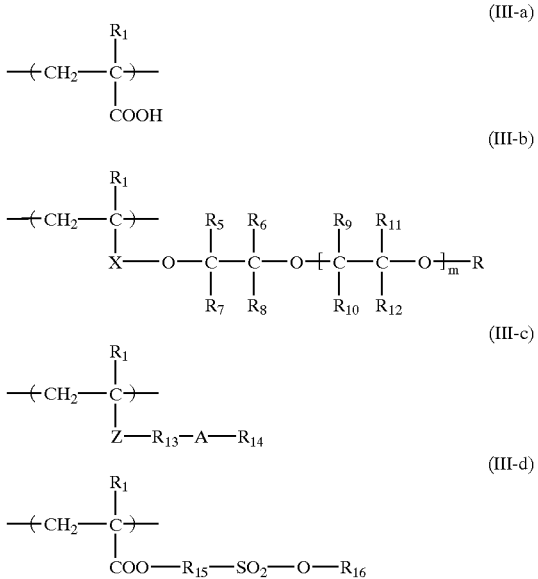

wherein $R_1$ represents a hydrogen atom, a halogen atom, an alkyl group having 1 to 4 carbon atoms; $R_5$ to $R_{12}$ each independently represents a hydrogen atom or an alkyl group; R represents a hydrogen atom, an alkyl, cycloalkyl, aryl or aralkyl group; m represents an integer of 1 to 10; X represents a single bond, an alkylene group, a cycloalkylene group, an arylene group, an ether group, a thioether group, a carbonyl group, an ester group, an amide group, a sulfonamide group, an urethane group, an urea group, or a divalent group which is not decomposed by the action of an acid, and which is a divalent group resulting from the combination of at least two groups selected from the group consisting of an alkylene group, a cycloalkylene group, an arylene group, an ether group, a thioether group, a carbonyl group, an ester group, an amide group, a sulfonamide group, an urethane group and an urea group; Z represents a single bond, an ether group, an ester group, an amide group, an alkylene group, or a divalent group resulting from the combination of at least two group of an ether group, an ester group, an amide group and an alkylene group; $R_{13}$ represents a single bond, an alkylene group, an arylene group, or a divalent group resulting from the combination of an alkylene group and an arylene group; $R_{15}$ represents an alkylene group, an arylene group, or a divalent group resulting from the combination of an alkylene group and an arylene group; $R_{14}$ represents an alkyl, cycloalkyl, aryl or aralkyl group; $R_{16}$ represents a hydrogen atom, an alkyl, cycloalkyl, alkenyl, aryl or aralkyl group; A represents one of the following functional groups:

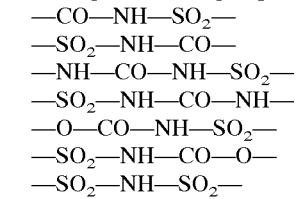

(6) The positive photoresist composition as described in the item (1), wherein the resin (B) contains the repeating unit having at least one of groups represented by formulae (I-1) to (I-4) in an amount of 30 to 70 mol %, base on the total repeating units.

(7) The positive photoresist composition as described in the item (2), wherein the resin (B) contains the repeating unit containing an alkali-soluble group protected by at least one of groups represented by formulae (pI) to (pVI) in an amount of 20 to 75 mol %, based on the total repeating units.

(8) The positive photoresist composition as described in the item (4), wherein the resin (B) contains the repeating unit represented by formula (a) in an amount of 10 to 40 mol %, based on the total repeating units.

(9) The positive photoresist composition as described in the item (5), wherein the resin (B) contains the repeating unit represented by formulae (III-a) to (III-d) in an amount of 0.1 to 30 mol %, based on the total repeating units.

(10) The positive photoresist composition as described in the item (1), wherein the compound (A) includes the compound (A1) in an amount of 5 to 96% by weight, based on the total content of the compound (A).

(11) The positive photoresist composition as described in the item (1), wherein the compound (A) includes the compound (A2) in an amount of 5 to 96% by weight, based on the total content of the compound (A).

(12) The positive photoresist composition as described in the item (1), wherein the compound (A1) comprises at least one compound selected from the group consisting of a sulfonium salt compound not having an aromatic ring, a triarylsulfonium salt compound, and a compound having a phenacylsulfonium salt structure, each of which is capable of generating an acid upon irradiation with one of an actinic ray and a radiation.

(13) The positive photoresist composition as described in the item (1), which further comprises (C) an acid diffusion inhibitor.

(14) The positive photoresist composition as described in the item (1), which further comprises (D) a surfactant containing at least one of a fluorine atom and a silicon atom.

(15) The positive photoresist composition as described in item (1), which comprises the compound (A) in an amount of 0.001 to 40% by weight, based on the total solid content of the composition.

(16) The positive photoresist composition described in item (1), which comprises the resin (B) in an amount of 40 to 99.99% by weight, based on the total solid content of the composition.

(17) The positive photoresist composition as described in the item (1), wherein the content ratio by weight of the compound (A1) to the compound (A2):(A1)/(A2) is 5/95 to 95/5.

(18) The positive photoresist composition as described in the item (1), which is a positive photoresist composition to be irradiated with a far ultraviolet ray of the wavelength of from 150 to 220 nm as an exposure light source.

DETAILED DESCRIPTION OF THE INVENTION

The compounds for use in the present invention are described in detail below.

(A) Compound Capable of Generating Acid by Irradiation with Actinic Ray or Radiation (Hereinafter Referred to as Light-acid Generating Agent or Component (A))

Component (A) for use in the present invention is a mixture comprising at least (A1) a sulfonate compound of a sulfonium, and (A2) a sulfonate compound of an N-hydroxyimide or a disulfonyldiazomethane compound.

(1) (A1) Sulfonate Compound of Sulfonium

As compound (A1), e.g., a triarylsulfonium salt, a sulfonium salt not having an aromatic ring, and a compound having a phenacylsulfonium salt structure, each of which can generates an acid by irradiation with an actinic ray or a radiation, can be exemplified.

The triarylsulfonium salt capable of generating an acid by irradiation with an actinic ray or a radiation (hereinafter referred to as an acid generating agent (I)) is a salt with a triarylsulfonium being a cation.

The aryl group of the triarylsulfonium cation is preferably a phenyl group and a naphthyl group, more preferably a phenyl group. Three aryl groups of the triarylsulfonium cation may be the same or different.

Each aryl group may be substituted with an alkyl group (e.g., an alkyl group having from 1 to 15 carbon atoms), an alkoxyl group (e.g., an alkoxyl group having from 1 to 15 carbon atoms), a halogen atom, a hydroxyl group or a phenylthio group. Of these substituents, an alkyl group having 4 or more carbon atoms and an alkoxyl group having 4 or more carbon atoms are preferred, and a t-butyl group and an alkoxyl group having from 1 to 4 carbon atoms are most preferred. The substituents may be substituted on any one of the three aryl groups or may be substituted on all of the three aryl groups. The substituent is preferably substituted on the p-position of the aryl group.

The anion of a triarylsulfonium salt is a sulfonate anion, preferably an alkanesulfonate anion substituted with a fluorine atom on the 1-position, and a benzenesulfonic acid substituted with an electron attractive group, more preferably a perfluoroalkanesulfonate anion having from 1 to 8 carbon atoms, and most preferably a perfluorobutanesulfonate anion and a perfluorooctanesulfonate anion. The decomposition velocity of an acid-decomposable group can be improved, the sensitivity is increased and the diffusibility of the acid generated is inhibited by using these compounds, resulting in the improvement of definition.

The triarylsulfonium structure may take the form of a plurality of triarylsulfonium structures bonded to other triarylsulfonium structure by a linking group, such as an —S— group.

The examples of the electron attractive groups include a fluorine atom, a chlorine atom, a bromine atom, a nitro group, a cyano group, an alkoxycarbonyl group, an acyloxy group and an acyl group.

The specific examples of the triarylsulfonium salts which can be used in the present invention include the following compounds, however, these examples should not be construed as limiting the scope of the present invention.

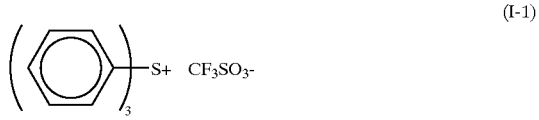
(I-1)

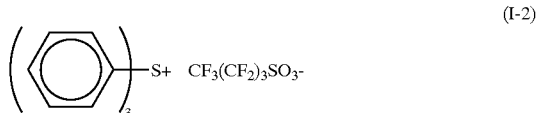
(I-2)

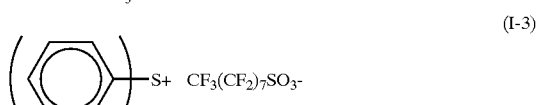
(I-3)

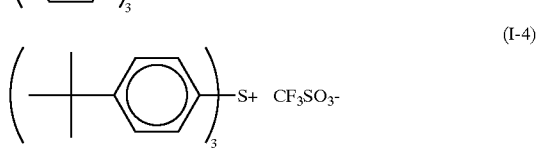
(I-4)

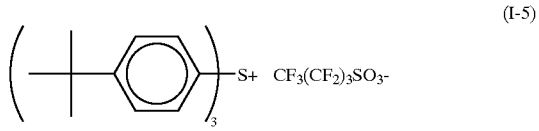
(I-5)

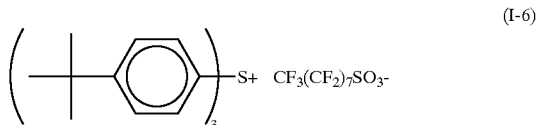
(I-6)

(I-7)

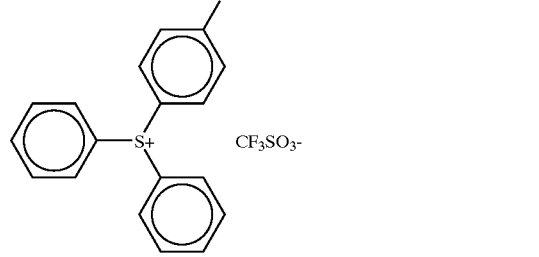

(I-8)
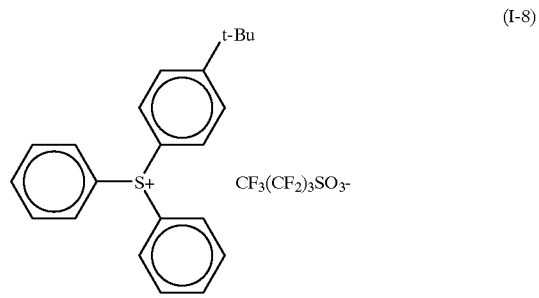

(I-9)
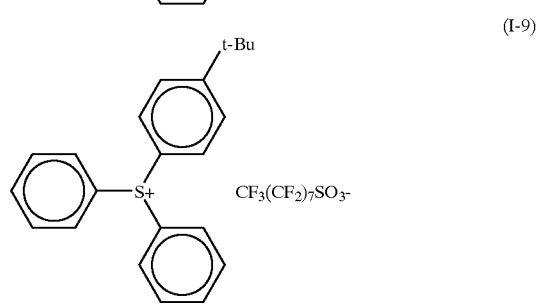

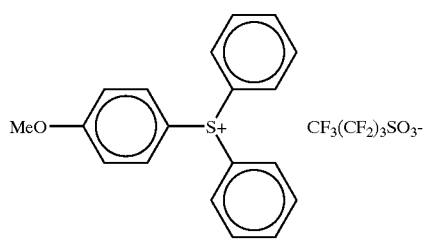
(I-10)
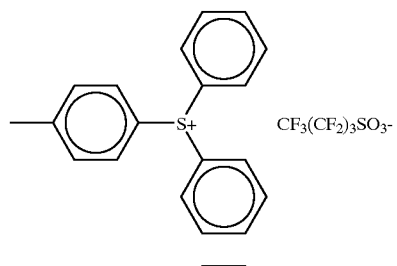
(I-11)
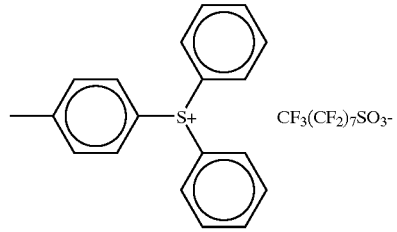
(I-12)
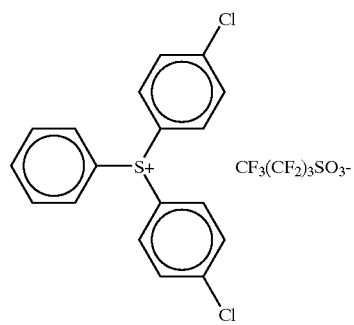
(I-13)
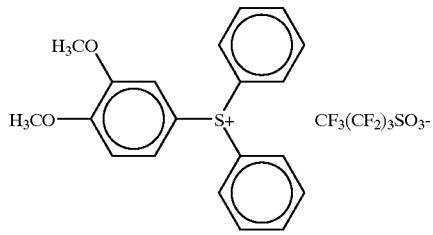
(I-14)
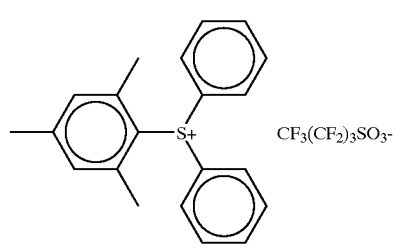
(I-15)
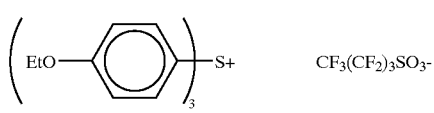
(I-16)
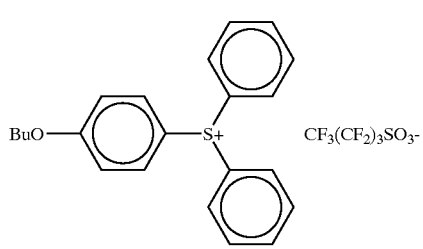
(I-17)
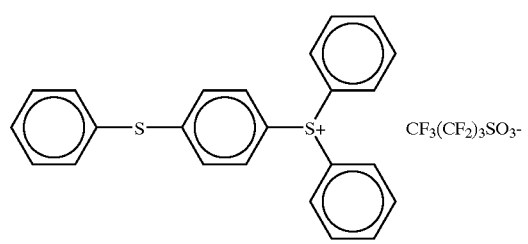
(I-18)
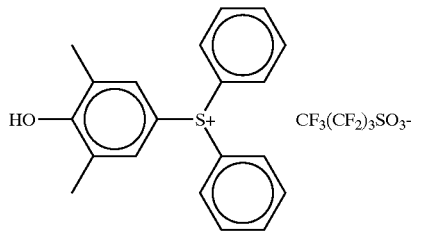
(I-19)
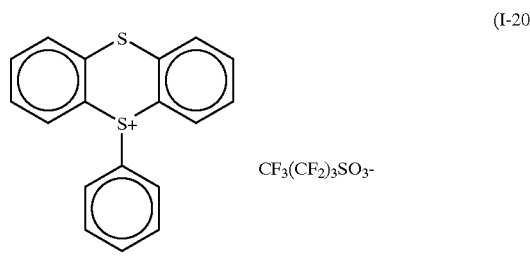
(I-20)
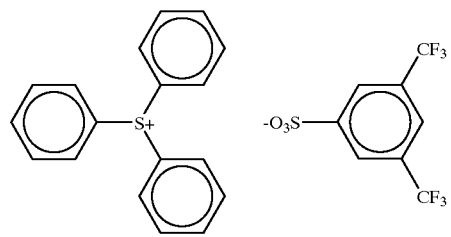
(I-21)
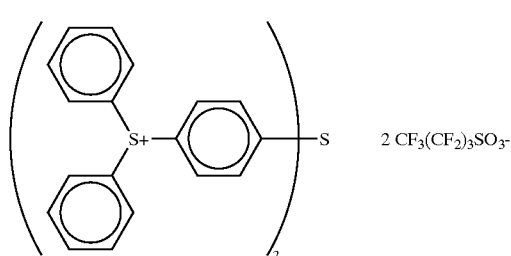
(I-22)
The sulfonium salt not having an aromatic ring is (hereinafter referred to as an acid generating agent (I)) is a salt with a sulfonium represented by the following formula (II) being a cation:

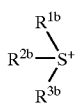
(II)

wherein $R^{1b}$, $R^{2b}$ and $R^{3b}$ each represents an organic group not having an aromatic ring, the aromatic ring here also includes aromatic rings containing hetero atoms.

The organic groups not having an aromatic ring represented by $R^{1b}$, $R^{2b}$ and $R^{3b}$ are organic groups generally having from 1 to 30, preferably from 1 to 20, carbon atoms.

$R^{1b}$, $R^{2b}$ and $R^{3b}$ each preferably represents an alkyl group, a 2-oxoalkyl group, an alkoxycarbonylmethyl group, an allyl group or a vinyl group, more preferably a straight chain, branched or cyclic 2-oxoalkyl group, or an alkoxycarbonylmethyl group, and most preferably a straight chain or branched 2-oxoalkyl group.

The alkyl groups represented by $R^{1b}$, $R^{2b}$ and $R^{3b}$ may be straight chain, branched or cyclic, preferably a straight chain or branched alkyl group having from 1 to 10 carbon atoms (e.g., methyl, ethyl, propyl, butyl and pentyl), or a cyclic alkyl group having from 3 to 10 carbon atoms (e.g., cyclopentyl, cyclohexyl and norbornyl).

The 2-oxoalkyl group represented by $R^{1b}$, $R^{2b}$ and $R^{3b}$ may be straight chain, branched or cyclic, preferably the above alkyl group having C=O on the 2-position can be exemplified.

The alkoxyl group in the above alkoxycarbonylmethyl group represented by $R^{1b}$, $R^{2b}$ and $R^{3b}$ is preferably an alkoxyl group having from 1 to 5 carbon atoms (e.g., methoxy, ethoxy, propoxy, butoxy and pentoxy).

$R^{1b}$, $R^{2b}$ and $R^{3b}$ may further be substituted with a halogen atom, an alkoxyl group (e.g., an alkoxyl group having from 1 to 5 carbon atoms), a hydroxyl group, a cyano group or a nitro group.

Two of $R^{1b}$, $R^{2b}$ and $R^{3b}$ may be bonded to form a cyclic structure, and an oxygen atom, a sulfur atom, an ester bond, an amide bond or a carbonyl group may be contained in the ring. The examples of the groups formed by bonding two of $R^{1b}$, $R^{2b}$ and $R^{3b}$ include alkylene groups (e.g., butylene and pentylene).

From the viewpoint of photo-reactivity, it is preferred that any one of $R^{1b}$, $R^{2b}$ and $R^{3b}$ should represent a group having a carbon-carbon double bond or a carbon-oxygen double bond.

The anion of the sulfonium salt not having an aromatic ring is a sulfonate anion, preferably an alkanesulfonate anion substituted with a fluorine atom on the 1-position, and a benzenesulfonic acid substituted with an electron attractive group, more preferably a perfluoroalkanesulfonate anion having from 1 to 8 carbon atoms, and most preferably a perfluorobutanesulfonate anion and a perfluorooctanesulfonate anion. The decomposition velocity of an acid-decomposable group can be improved, the sensitivity is increased and the diffusibility of the acid generated is inhibited by using these compounds, resulting in the improvement of definition.

The examples of the electron attractive groups include a fluorine atom, a chlorine atom, a bromine atom, a nitro group, a cyano group, an alkoxycarbonyl group, an acyloxy group and an acyl group.

At least one of $R^{1b}$, $R^{2b}$ and $R^{3b}$ of a compound represented by formula (II) may be bonded to at least one of $R^{1b}$, $R^{2b}$ and $R^{3b}$ of other compound represented by formula (II).

The specific examples of the sulfonium salts not having an aromatic ring which can be used in the present invention include the following compounds, however, these examples should not be construed as limiting the scope of the present invention.

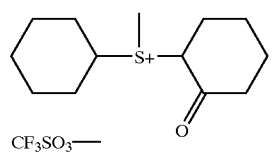
(II-1)

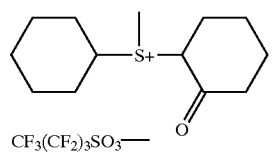
(II-2)

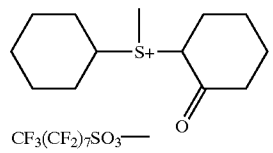
(II-3)

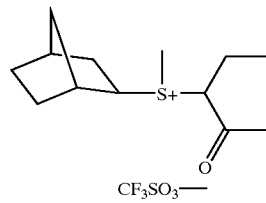
(II-4)

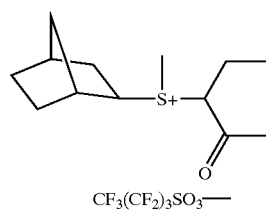
(II-5)

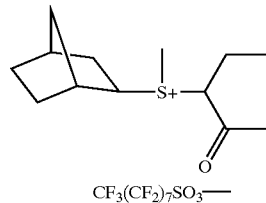
(II-6)

(II-7)

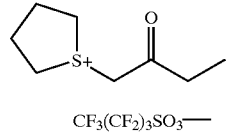
(II-8)

(II-9) 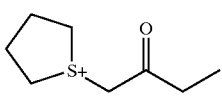

(II-10) 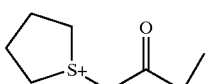

(II-11) 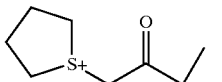

(II-12) 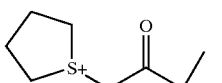

(II-13) 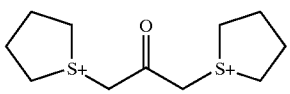

(II-14) 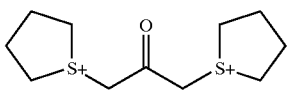

(II-15) 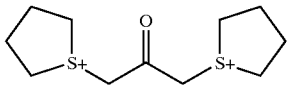

(II-16) 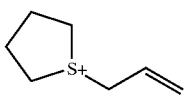

(II-17) 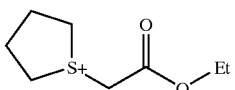

(II-18) 

(II-19) 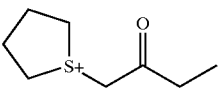

(II-20) 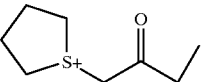

(II-21) 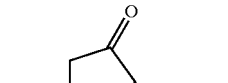

(II-22) 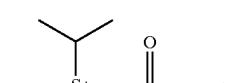

The compound having a phenacylsulfonium salt structure capable of generating an acid upon irradiation with an actinic ray or a radiation is, e.g., a compound represented by the following formula (III):

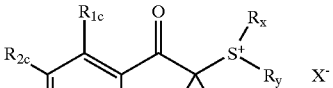

(III)

wherein $R_{1c}$, $R_{2c}$, $R_{3c}$, $R_{4c}$ and $R_{5c}$ each represents a hydrogen atom, an alkyl group, an alkoxyl group or a halogen atom; $R_{6c}$ and $R_{7c}$ each represents a hydrogen atom, an alkyl group or an aryl group; and $R_x$ and $R_y$ each represents an alkyl group, a 2-oxoalkyl group, an alkoxycarbonylmethyl group, an allyl group or a vinyl group.

Any two or more of $R_{1c}$, $R_{2c}$, $R_{3c}$, $R_{4c}$, $R_{5c}$, $R_{6c}$ and $R_{7c}$, and $R_x$ and $R_y$ may be bonded to form a cyclic structure, and the cyclic structure may contain an oxygen atom, a sulfur atom, an ester bond, or an amide bond.

$X^-$ represents an anion of a sulfonic acid, a carboxylic acid or a sulfonylimide.

The alkyl group represented by $R_{1c}$, $R_{2c}$, $R_{3c}$, $R_{4c}$ and $R_{5c}$ may be straight chain, branched or cyclic, e.g., an alkyl group having from 1 to 10 carbon atoms, preferably a straight chain or branched alkyl group having from 1 to 5 carbon atoms (e.g., methyl, ethyl, straight chain or branched propyl, straight chain or branched butyl, and straight chain or branched pentyl), and a cyclic alkyl group having from 3 to 8 carbon atoms (e.g., cyclopentyl and cyclohexyl) can be exemplified.

The alkoxyl group represented by $R_{1c}$, $R_{2c}$, $R_{3c}$, $R_{4c}$ and $R_{5c}$ may be straight chain, branched or cyclic, e.g., an alkoxyl group having from 1 to 10 carbon atoms, preferably a straight chain or branched alkoxyl group having from 1 to 5 carbon atoms (e.g., methoxy, ethoxy, straight chain or branched propoxy, straight chain or branched butoxy and straight chain or branched pentoxy), and a cyclic alkoxyl group having from 3 to 8 carbon atoms (e.g., cyclopentyloxy and cyclohexyloxy) can be exemplified.

Preferably any of $R_{1c}$, $R_{2c}$, $R_{3c}$, $R_{4c}$ and $R_{5c}$ represents a straight chain, branched or cyclic alkyl group, or a straight chain, branched or cyclic alkoxyl group, more preferably the sum of the carbon atoms of $R_{1c}$, $R_{2c}$, $R_{3c}$, $R_{4c}$ and $R_{5c}$ is from 2 to 15, by which the solubility of a solvent is improved and the generation of particles during storage can be inhibited.

As the alkyl groups represented by $R_{6c}$ and $R_{7c}$, the same alkyl groups as represented by $R_{1c}$, $R_{2c}$, $R_{3c}$, $R_{4c}$ and $R_{5c}$ can be exemplified. As the aryl groups represented by $R_{6c}$ and $R_{7c}$, e.g., an aryl group having from 6 to 14 carbon atoms (e.g., phenyl) can be exemplified.

As the alkyl groups represented by $R_x$ and $R_y$, the same alkyl groups as represented by $R_{1c}$, $R_{2c}$, $R_{3c}$, $R_{4c}$ and $R_{5c}$ can be exemplified.

As the 2-oxoalkyl groups represented by $R_x$ and $R_y$, the same alkyl groups as represented by $R_{1c}$, $R_{2c}$, $R_{3c}$, $R_{4c}$ and $R_{5c}$ having C=O on the 2-position can be exemplified.

As the alkoxyl groups in the alkoxycarbonylmethyl group represented by $R_x$ and $R_y$, the same alkoxyl groups as defined in $R_{1c}$, $R_{2c}$, $R_{3c}$, $R_{4c}$ and $R_{5c}$ can be exemplified.

As the groups formed by bonding $R_x$ and $R_y$, a butylene group and a pentylene group can be exemplified.

$X^-$ preferably represents a sulfonate anion, more preferably an alkanesulfonate anion substituted with a fluorine atom on the 1-position, and a benzenesulfonic acid substituted with an electron attractive group. The alkane moiety of the alkanesulfonate anion may be substituted with an alkoxyl group (e.g., having from 1 to 8 carbon atoms), or a perfluoroalkoxy group (e.g., having from 1 to 8 carbon atoms). The examples of the electron attractive groups include a fluorine atom, a chlorine atom, a bromine atom, a nitro group, a cyano group, an alkoxycarbonyl group, an acyloxy group and an acyl group.

$X^-$ more preferably represents a perfluoroalkanesulfonate anion having from 1 to 8 carbon atoms, particularly preferably a perfluorooctanesulfonate anion, and most preferably a perfluorobutanesulfonate anion and a trifluoromethanesulfonate anion. The decomposition velocity of an acid-decomposable group can be improved, the sensitivity is increased and the diffusibility of the acid generated is inhibited by using these compounds, resulting in the improvement of definition.

The specific examples of the compounds having a phenacylsulfonium salt structure which can be used in the present invention are shown below, however, these compounds should not be construed as limiting the scope of the present invention.

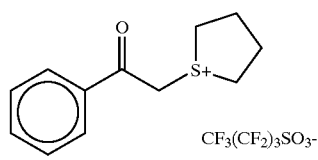

(III-1)

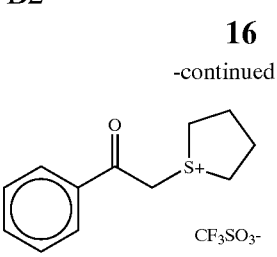

(III-2)

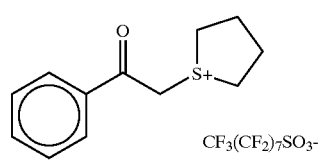

(III-3)

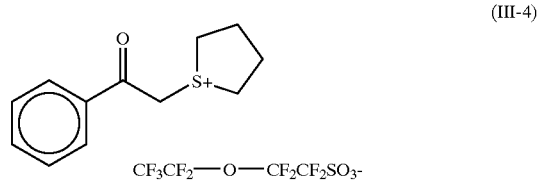

(III-4)

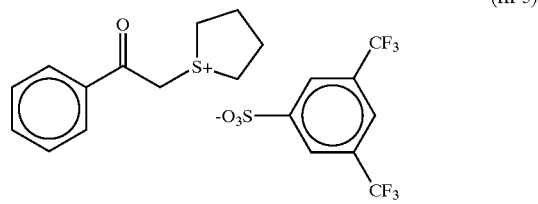

(III-5)

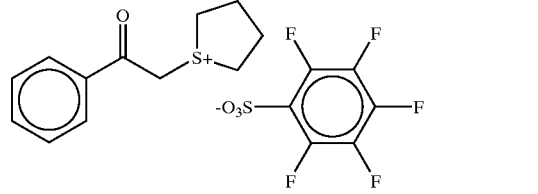

(III-6)

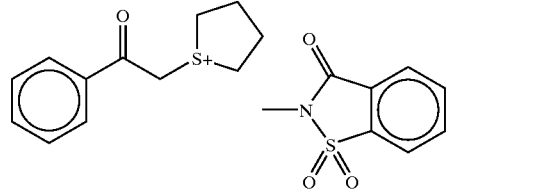

(III-7)

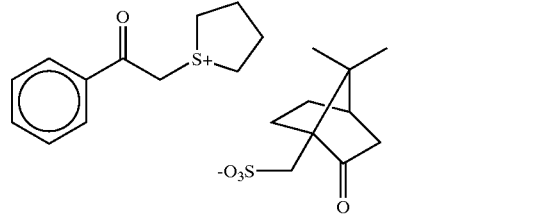

(III-8)

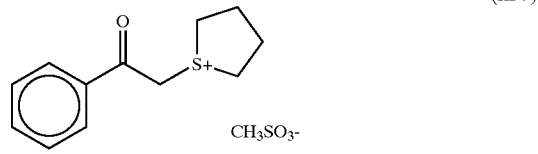

(III-9)

(III-10)
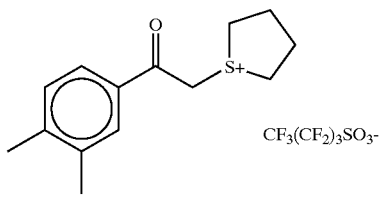

(III-11)
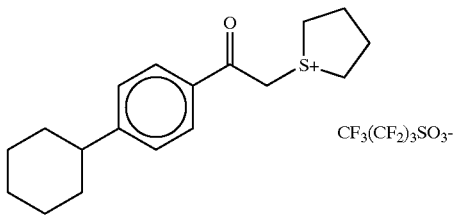

(III-12)
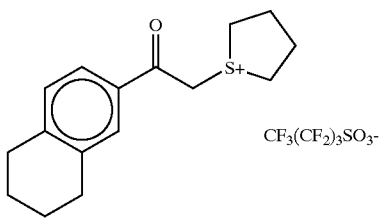

(III-13)
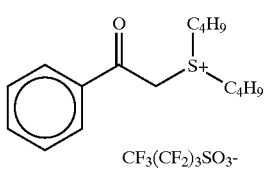

(III-14)
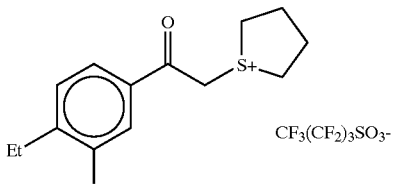

(III-15)
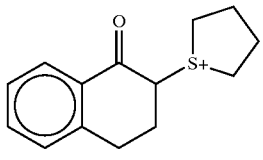

(III-16)
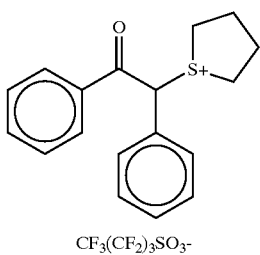

(III-17)
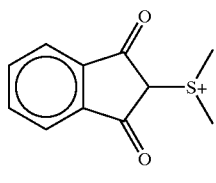

(III-18)
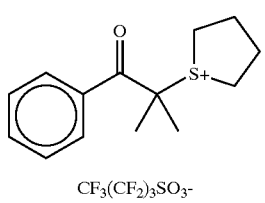

(2) (A2) Sulfonate Compound of N-hydroxyimide or disulfonyldiazomethane Compound As the sulfonate compound of an N-hydroxyimide (A2), e.g., an iminosulfonate derivative represented by the following formula (A2-1) can be exemplified:

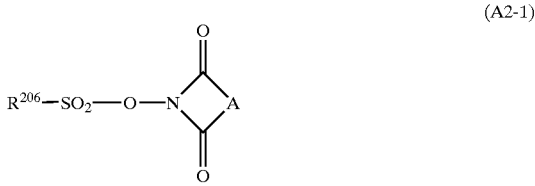
(A2-1)

wherein $R^{206}$ represents a substituted or unsubstituted alkyl group or a substituted or unsubstituted aryl group; and A represents a substituted or unsubstituted alkylene group, a substituted or unsubstituted alkenylene group, or a substituted or unsubstituted arylene group.

The following compounds can be exemplified as the specific examples thereof but the present invention is not limited thereto.

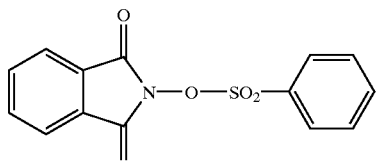
(A2-1-1)

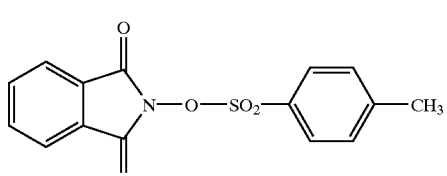
(A2-1-2)

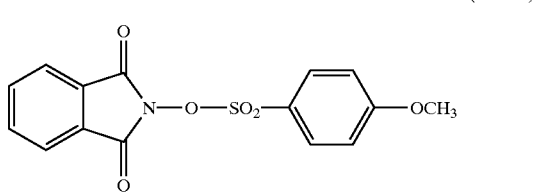
(A2-1-3)

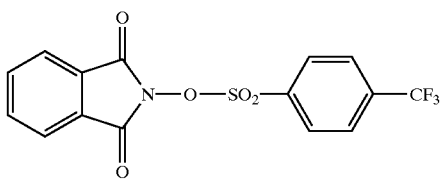 (A2-1-4)
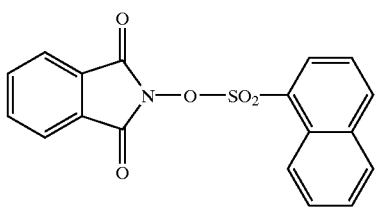 (A2-1-5)
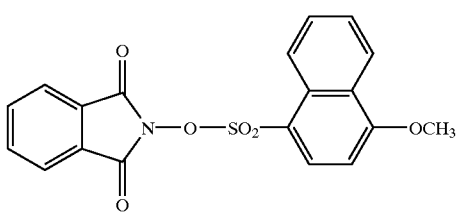 (A2-1-6)
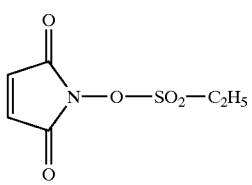 (A2-1-7)
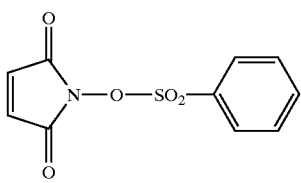 (A2-1-8)
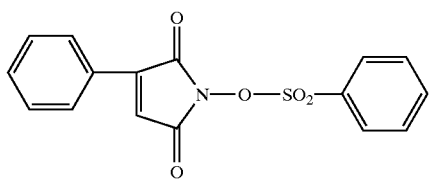 (A2-1-9)
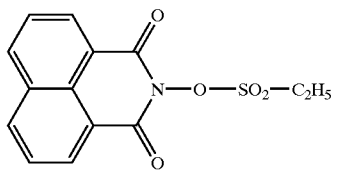 (A2-1-10)
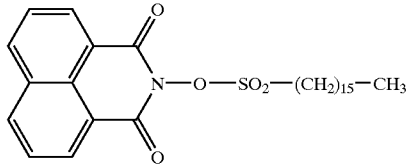 (A2-1-11)
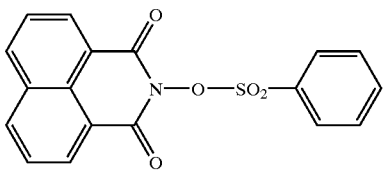 (A2-1-12)
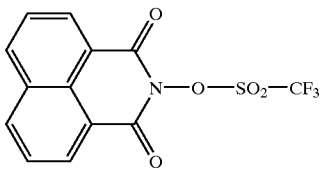 (A2-1-13)
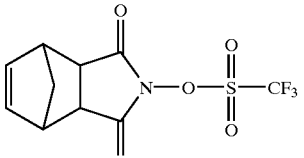 (A2-1-14)
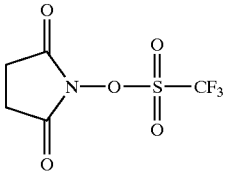 (A2-1-15)
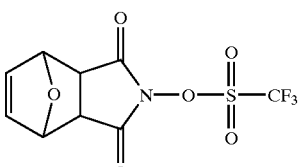 (A2-1-16)
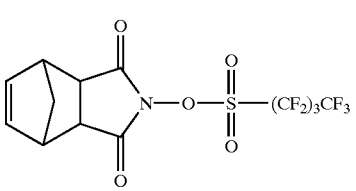 (A2-1-17)
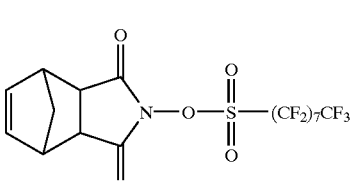 (A2-1-18)
As the disulfonyldiazomethane compound (A2), e.g., a diazodisulfone derivative represented by the following formula (A2-2) can be exemplified:
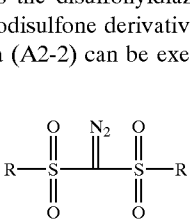 (A2-2)
wherein R represents a straight chain, branched or cyclic alkyl group or an aryl group which may be substituted.

the following compounds can be exemplified as the specific example thereof but the present invention is not limited thereto.

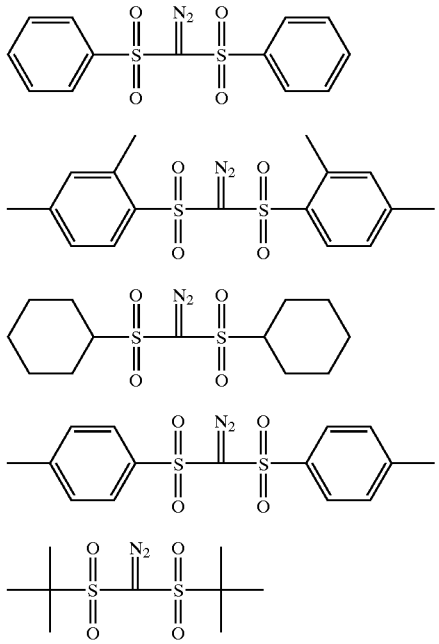

(A2-2-1)
(A2-2-2)
(A2-2-3)
(A2-2-4)
(A2-2-5)

Light-acid generating agent (A) in the present invention comprises a compound of (A1) and a compound of (A2). Other light-acid generating agents may further be selected from compounds of (A1) and compounds of (A2) and added.

The content of light-acid generating agent (A1) in light-acid generating agent (A) is preferably from 5 to 95 wt %, more preferably from 10 to 90 wt %, and still more preferably from 15 to 85 wt %, of the total content of light-acid generating agent (A).

The content of light-acid generating agent (A2) in light-acid generating agent (A) is preferably from 5 to 95 wt %, more preferably from 10 to 90 wt %, and still more preferably from 15 to 85 wt %, of the total content of light-acid generating agent (A).

The content ratio by weight of the compound (A1) to the compound (A2):(A1)/(A2) is preferably 5/95 to 95/5, more preferably 10/90 to 90/10, still more preferably 15/85 to 85/15.

Light-acid generating agent (A) in the present invention may further use other light-acid generating agents in combination.

When other light-acid generating agents are used in combination, the content of other light-acid generating agents usable in combination in light-acid generating agent (A) is preferably from 5 to 95 wt %, more preferably from 5 to 40 wt %, and still more preferably from 5 to 35 wt %, of the total content of light-acid generating agent (A).

Of the compounds capable of decomposing upon irradiation with an actinic ray or a radiation and generating an acid which can be used in combination with light-acid generating agent (A), those particularly effectively used in the present invention are described below.

(1) An oxazole derivative substituted with a trihalomethyl group represented by the following formula (PAG1), and an S-triazine derivative represented by the following formula (PAG2):

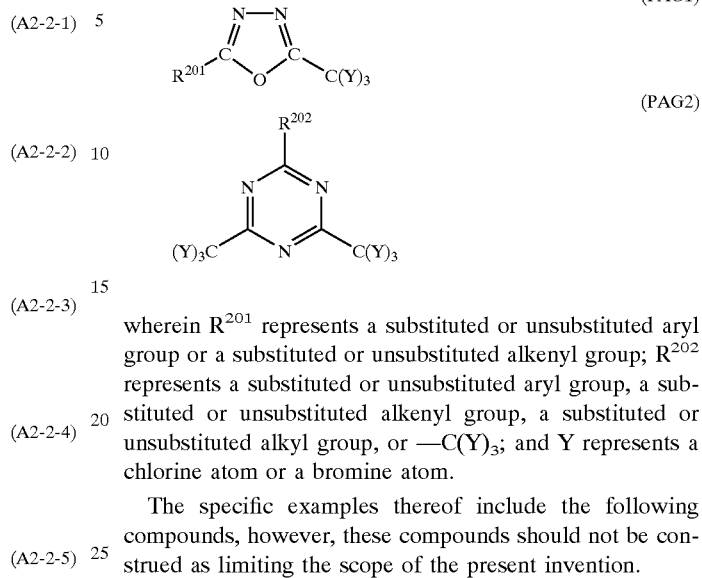

(PAG1)
(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group, or $-C(Y)_3$; and Y represents a chlorine atom or a bromine atom.

The specific examples thereof include the following compounds, however, these compounds should not be construed as limiting the scope of the present invention.

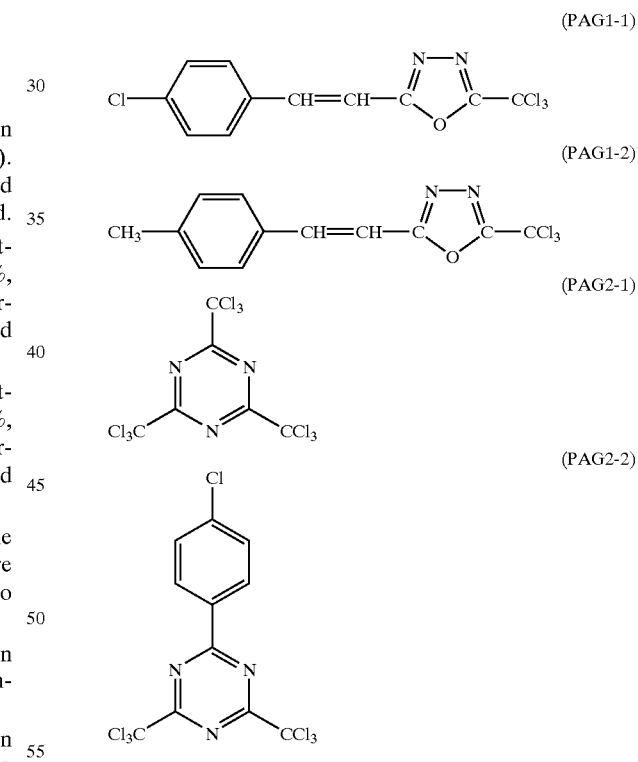

(PAG1-1)
(PAG1-2)
(PAG2-1)
(PAG2-2)

(2) A disulfone derivative represented by the following formula (PAG5), and an iminosulfonate derivative represented by the following formula (PAG6):

$Ar^3-SO_2-SO_2-Ar^4$ (PAG5)

wherein $Ar^3$ and $Ar^4$ each represents a substituted or unsubstituted aryl group.

The specific examples thereof include the following compounds but the present invention is not limited thereto.

(PAG5-1) 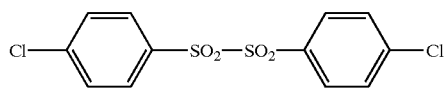

(PAG5-2) 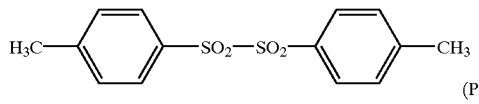

(PAG5-3) 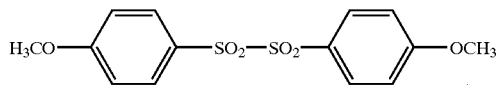

(PAG5-4) 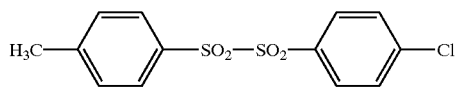

(PAG5-5) 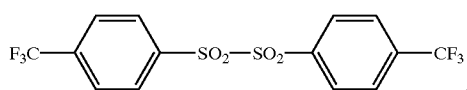

(PAG5-6) 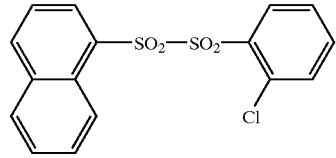

(PAG5-7) 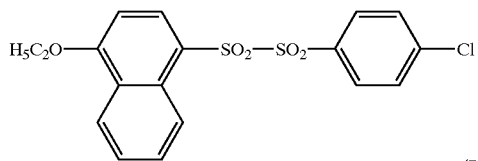

(PAG5-8) 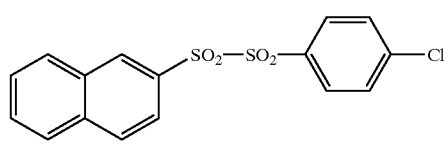

(PAG5-9) 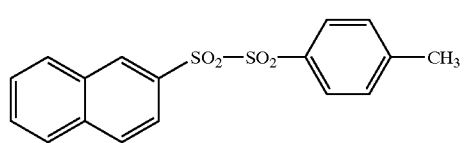

(PAG5-10) 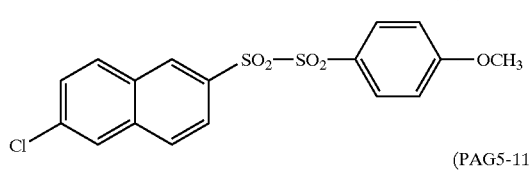

(PAG5-11) 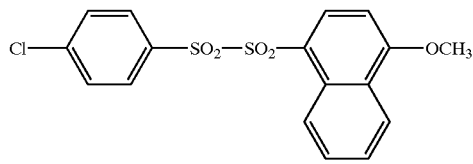

(PAG5-12) 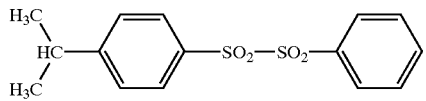

(PAG5-13) 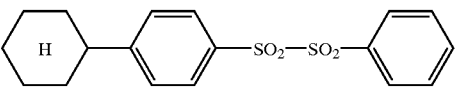

The addition amount of light-acid generating agent (A) is generally from 0.001 to 40 wt % based on the solid content in the composition, preferably from 0.01 to 20 wt %, and more preferably from 0.1 to 5 wt %.

When the addition amount of light-acid generating agent (A) is less than 0.001 wt %, the sensitivity lowers, while when the amount is larger than 40 wt %, light absorption of the resist becomes too high, resulting in the deterioration of profile and the narrowing of process margin (in particular, baked).

(B) Resin Capable of Decomposing by the Action of Acid to Increase Solubility in Alkali Developer A resin capable of decomposing by the action of an acid to increase the solubility in an alkali developer (B) in the present invention (hereinafter referred to as merely resin (B)) contains a repeating unit having a group represented by the above formula (I-1), (I-2), (I-3) or (I-4).

In formulae (I-1), (I-2), (I-3) and (I-4), the alkyl group represented by $R_1$, $R_2$, $R_3$, $R_4$ and $R_5$ is a straight chain or branched alkyl group, which may have a substituent. The straight chain or branched alkyl group is preferably a straight chain or branched alkyl group having from 1 to 12 carbon atoms, more preferably a straight chain or branched alkyl group having from 1 to 10 carbon atoms, and still more preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group, or a decyl group.

The cycloalkyl group represented by $R_1$, $R_2$, $R_3$, $R_4$ and $R_5$ is preferably a cycloalkyl group having from 3 to 8 carbon atoms, e.g., a cyclopropyl group, a cyclopentyl group, a cyclohexyl group, a cycloheptyl group and a cyclooctyl group.

The alkenyl group represented by $R_1$, $R_2$, $R_3$, $R_4$ and $R_5$ is preferably an alkenyl group having from 2 to 6 carbon atoms, e.g., a vinyl group, a propenyl group, a butenyl group and a hexenyl group.

As the rings formed by bonding two of $R_1$, $R_2$, $R_3$, $R_4$ and $R_5$, 3- to 8-membered rings, e.g., a cyclopropane ring, a cyclobutane ring, a cyclopentane ring, a cyclohexane ring and a cyclooctane ring can be exemplified.

In formulae (I-1) and (I-2), $R_1$, $R_2$, $R_3$, $R_4$ and $R_5$ may be bonded to any of seven carbon atoms constituting the cyclic skeleton.

The substituents of the substituted alkyl, cycloalkyl and alkenyl groups include, e.g., an alkoxyl group having from 1 to 4 carbon atoms, a halogen atom (e.g., fluorine, chlorine, bromine and iodine), an acyl group, an acyloxy group, a cyano group, a hydroxyl group, a carboxyl group, an alkoxycarbonyl group, or a nitro group.

7The repeating unit having a group represented by formula (I-1), (I-2), (I-3) or (I-4) is preferably a repeating unit represented by the following formula (AI):

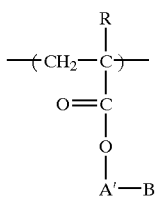
(AI)

wherein R has the same meaning as R in the above formula (a) A' represents a single bond, an ether group, an ester group, a carbonyl group, an alkylene group or a divalent linking group consisting of these groups in combination. B represents any group represented by formula (I-1), (I-2), (I-3) or (I-4). The divalent linking group in A' includes, e.g., the following.

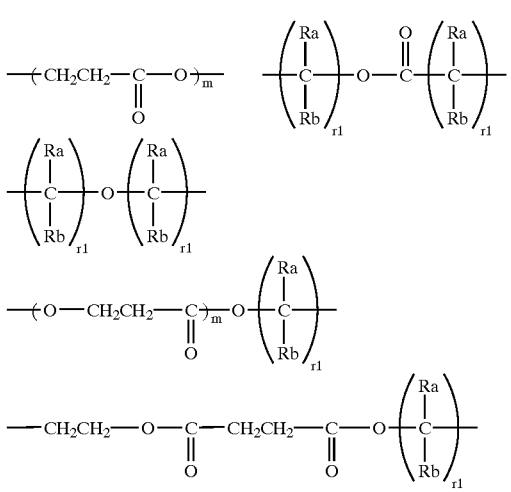

In the above formulae, $R_a$, $R_b$ and $r_1$ each has the same meaning as described above, and m represents an integer of from 1 to 3.

The specific examples of the repeating units represented by formula (AI) are shown below, however, these compounds should not be construed as limiting the scope of the present invention.

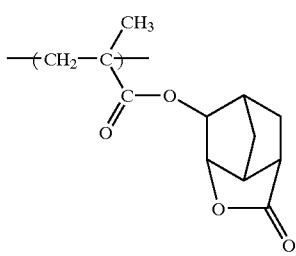
(I-1)

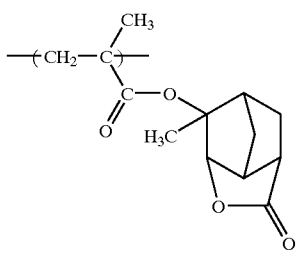
(I-2)

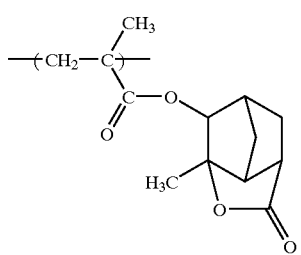
(I-3)

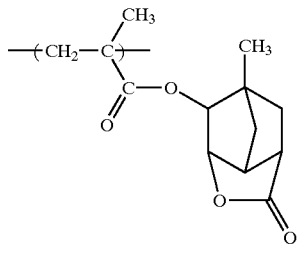
(I-4)

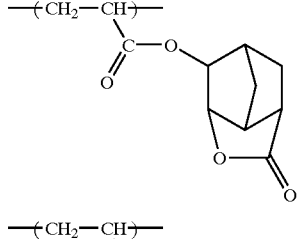
(I-5)

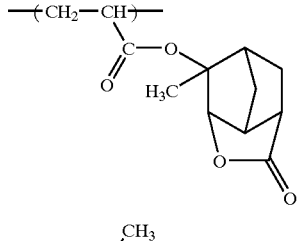
(I-6)

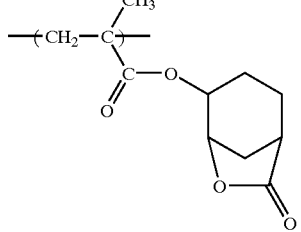
(I-7)

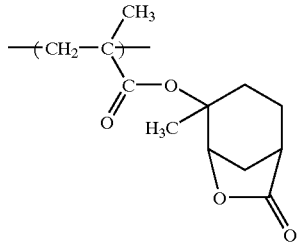
(I-8)

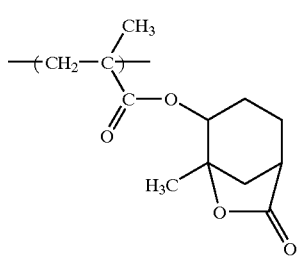
(I-9)

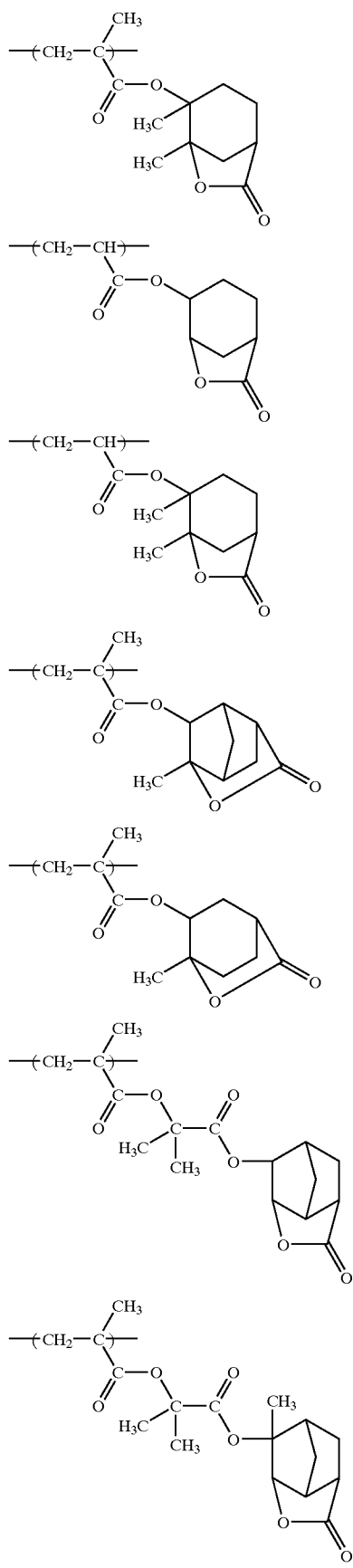
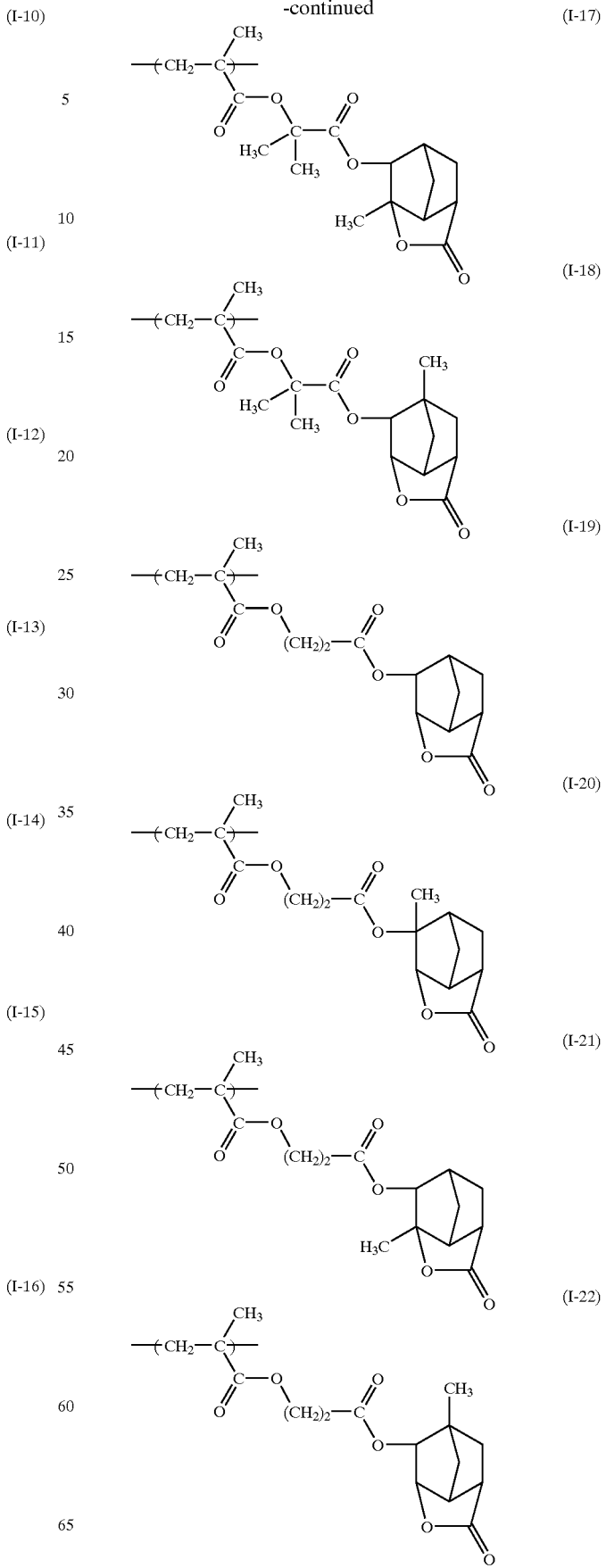

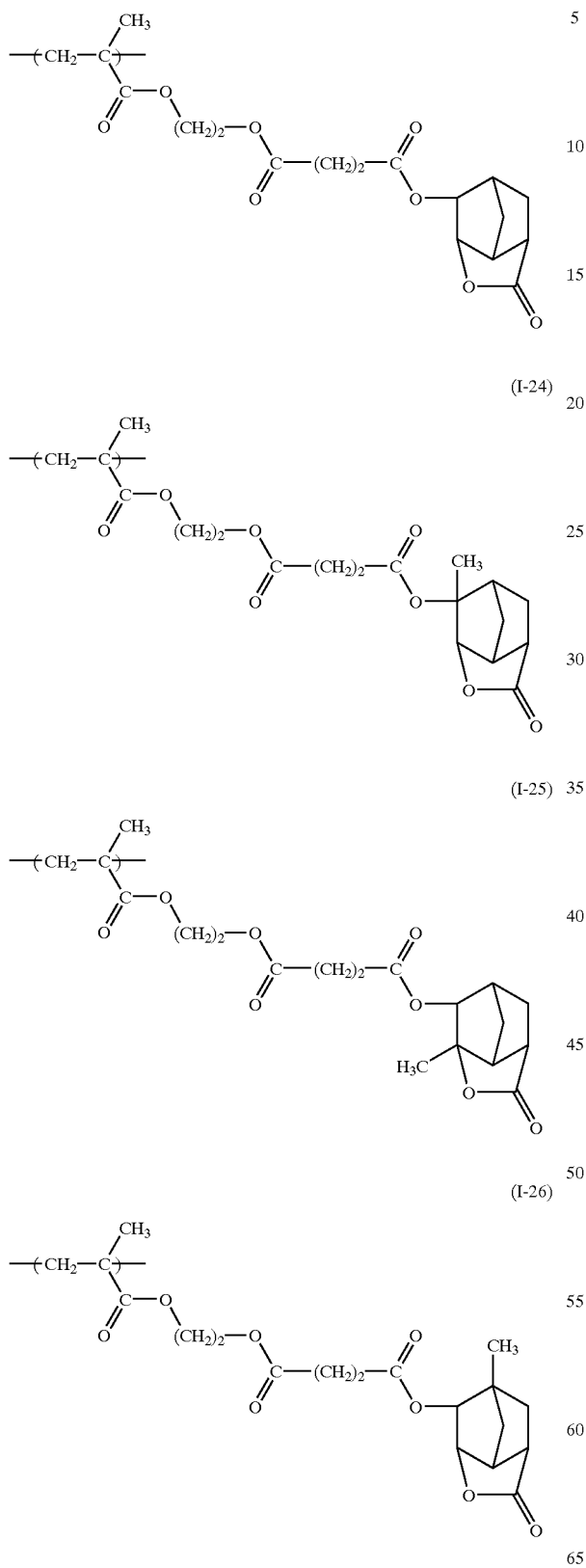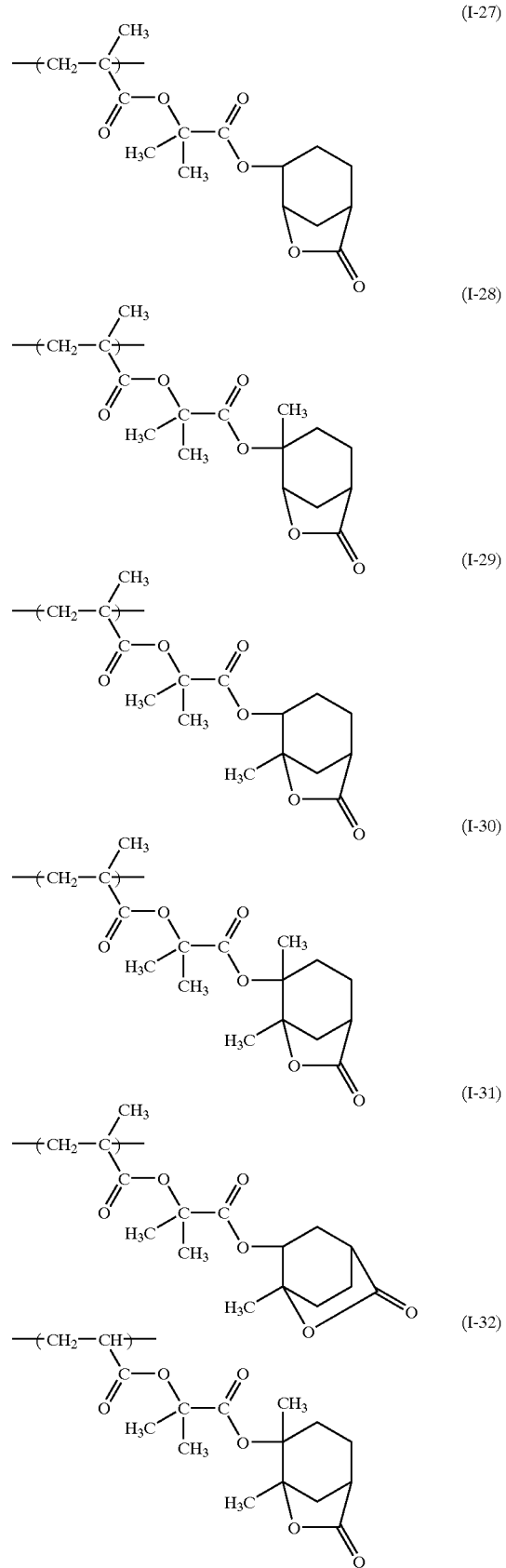

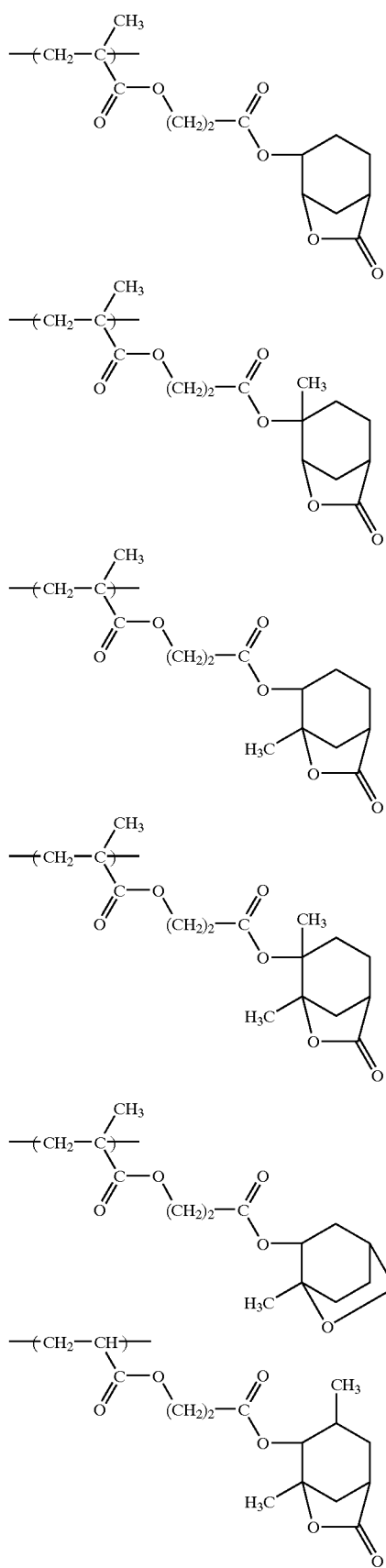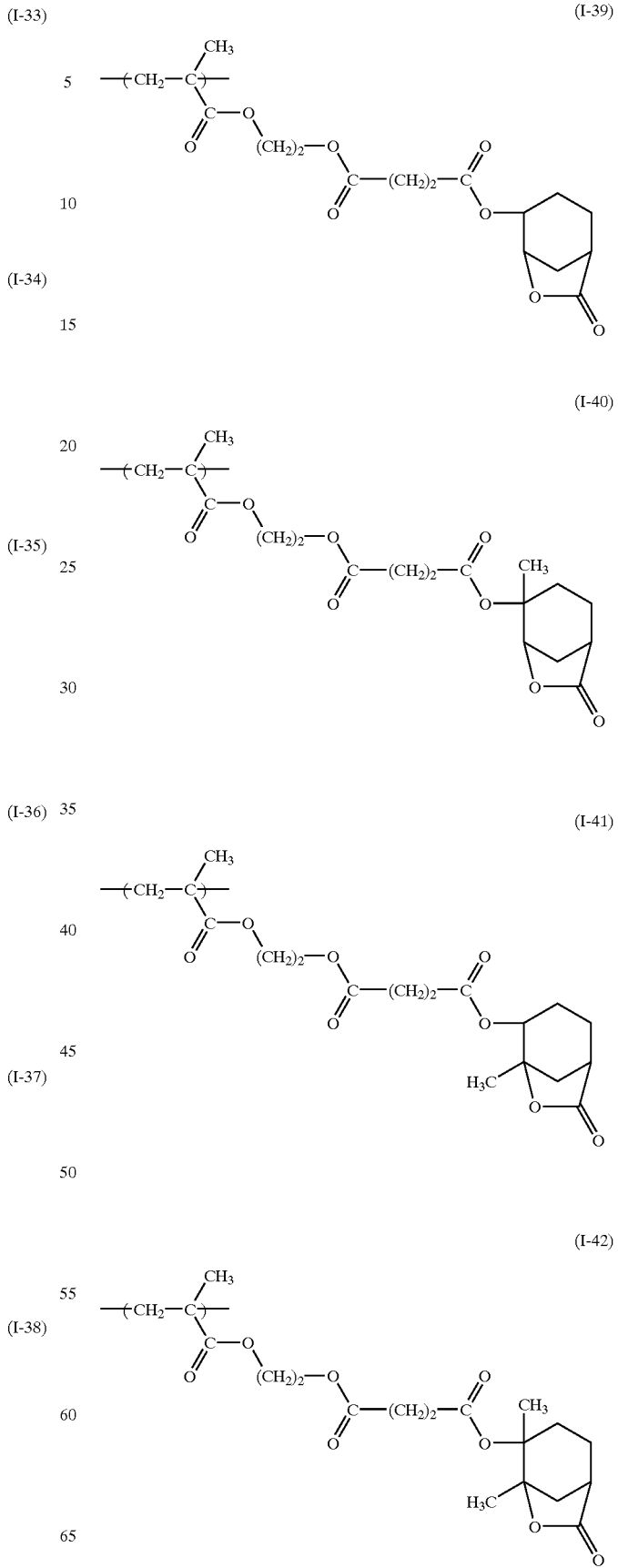

(I-43)

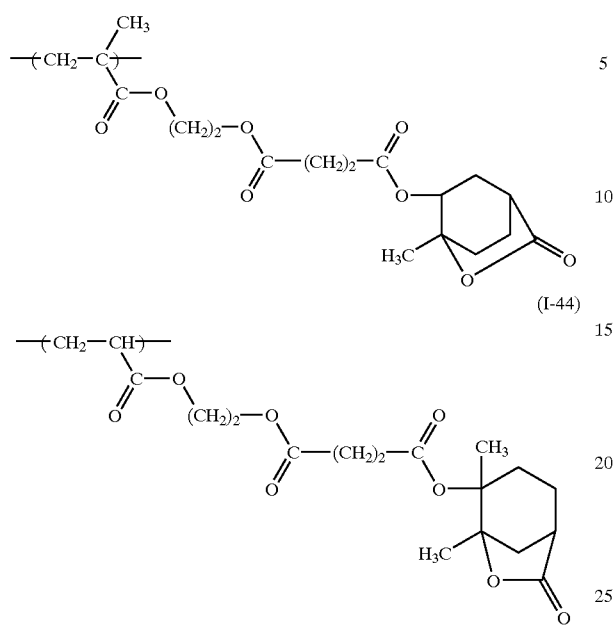

(I-44)

In the present invention, it is preferred for resin (B) to contain a repeating unit having an alkali-soluble group protected by at least one group containing an alicyclic hydrocarbon structure represented by formula (pI), (pII), (pIII), (pIV), (pV) or (pVI) in view of capable of exhibiting the effect of the present invention more noticeably.

In formulae (pI), (pII), (pIII), (pIV), (pV) and (pVI), the alkyl group represented by $R_{12}$ to $R_{25}$ is a substituted or unsubstituted, straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group can be exemplified.

The examples of the substituents of the substituted alkyl group include an alkoxyl group having from 1 to 4 carbon atoms, a halogen atom (e.g., fluorine, chlorine, bromine and iodine), an acyl group, an acyloxy group, a cyano group, a hydroxyl group, a carboxyl group, an alkoxycarbonyl group, and a nitro group.

The alicyclic hydrocarbon group represented by $R_{11}$ to $R_{25}$ and the alicyclic hydrocarbon group formed by Z and carbon atoms may be monocyclic or polycyclic. Specifically, groups having a monocyclo, bicyclo, tricyclo, or tetracyclo structure and 5 or more carbon atoms, preferably from 6 to 30, and particularly preferably from 7 to 25, can be exemplified. These alicyclic hydrocarbon groups may have a substituent.

The structural examples of alicyclic moieties of the groups containing an alicyclic hydrocarbon structure are shown below.

(1) 

(2) 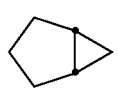

(3) 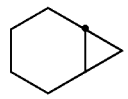

(4) 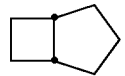

(5) 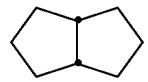

(6) 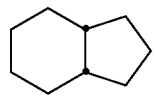

(7) 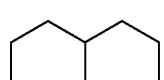

(8) 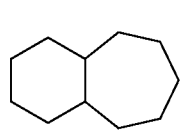

(9) 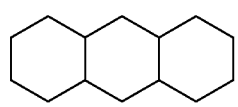

(10) 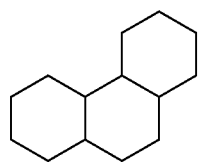

(11) 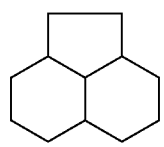

(12) 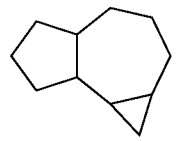

(13) 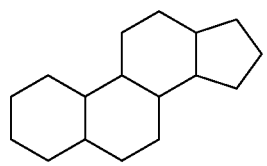

(14) 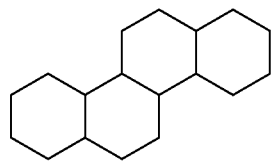

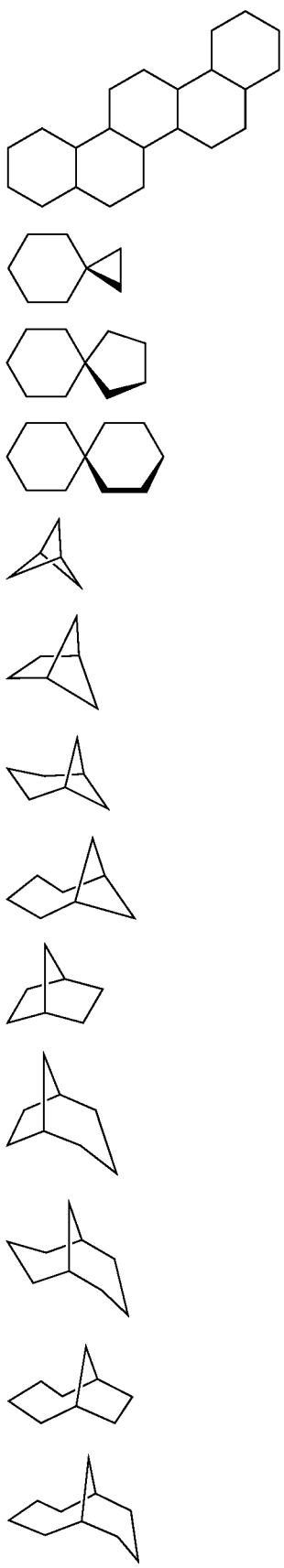
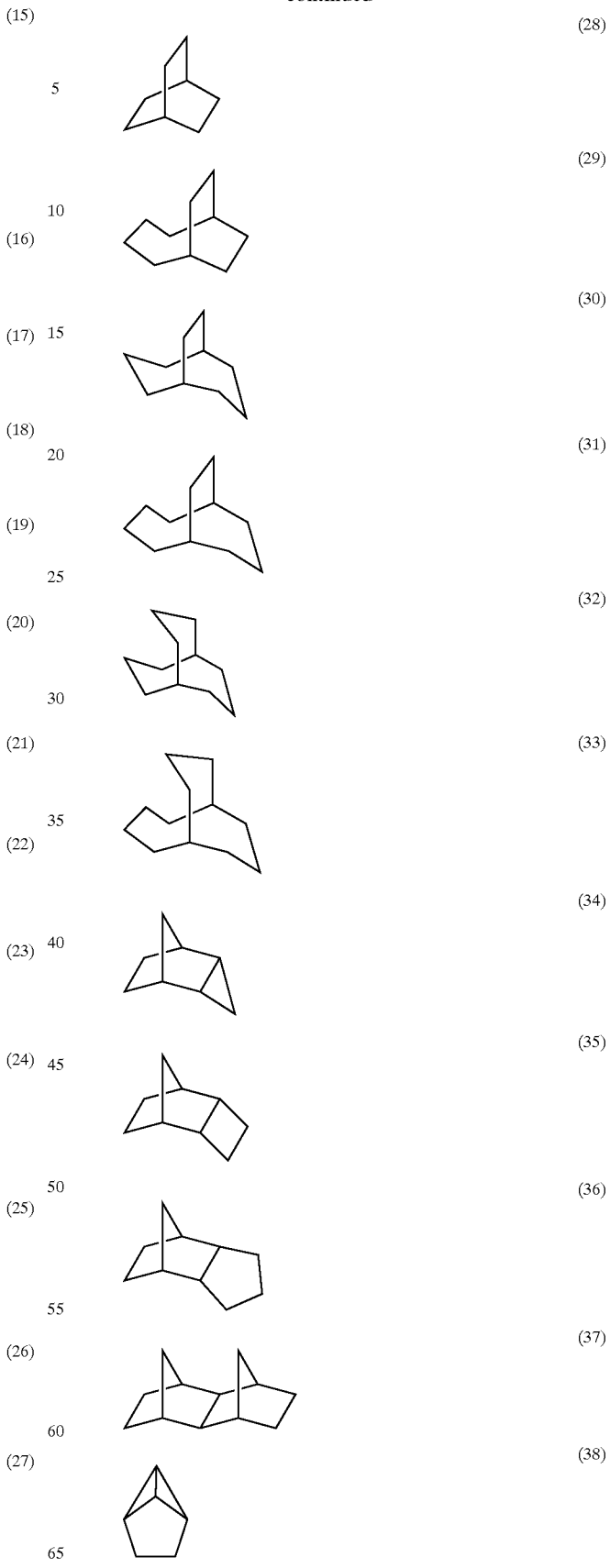

-continued

(39) 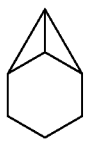

(40) 

(41) 

(42) 

(43) 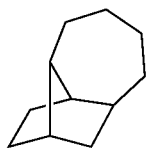

(44) 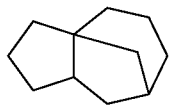

(45) 

(46) 

(47) 

(48) 

(49) 

(50) 

An adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group are exemplified as the preferred of the above alicyclic moieties in the present invention, and an adamantyl group, a decalin residue, a norbornyl group, a cedrol group, a cyclohexyl group, a cycloheptyl group, a cyclooctyl group, a cyclodecanyl group, and a cyclododecanyl group are more preferred.

The examples of the substituents of the alicyclic hydrocarbon groups include an alkyl group, a substituted alkyl group, a cycloalkyl group, an alkenyl group, an acyl group, a halogen atom, a hydroxyl group, an alkoxyl group, a carboxyl group, and an alkoxycarbonyl group. The alkyl group is preferably a lower alkyl group, e.g., a methyl group, an ethyl group, a propyl group, an isopropyl group, and a butyl group, more preferably a methyl group, an ethyl group, a propyl group, and an isopropyl group. The examples of the substituents of the substituted alkyl group include a hydroxyl group, a halogen atom, and an alkoxyl group. The alkoxyl group (including the alkoxyl group of the alkoxycarbonyl group) is an alkoxyl group having from 1 to 4 carbon atoms, e.g., a methoxy group, an ethoxy group, a propoxy group or a butoxy group.

As the cycloalkyl group, a cyclopropyl group, a cyclopentyl group and a cyclohexyl group can be exemplified.

As the alkenyl group, an alkenyl group having from 2 to 6 carbon atoms can be exemplified, specifically a vinyl group, a propenyl group, an allyl group, a butenyl group, a pentenyl group and a hexenyl group can be exemplified.

As the acyl group, an acetyl group, an ethylcarbonyl group, and a propylcarbonyl group can be exemplified. As the halogen atom, a chlorine atom, a bromine atom, an iodine atom and a fluorine atom can be exemplified.

Of the structures represented by formula (pI), (pII), (pIII), (pIV), (pV) or (pVI), the structure represented by formula (pI) is preferred. The group containing an alicyclic hydrocarbon structure represented by formula (pI), (pIII), (pIII), (pIV), (pV) or (pVI) is more preferably represented by formula (II). As the alkyl group represented by $R_{28}$ and the halogen atom, the alkyl, cycloalkyl, alkenyl, alkoxyl, alkoxycarbonyl and acyl groups represented by $R_{29}$, $R_{30}$ and $R_{31}$, the same groups as described in the substituents of the alicyclic hydrocarbon group can be exemplified.

As the alkali-soluble group protected by the structure represented by formula (pI), (pII), (pIII), (pIV), (pV) or (pVI), various alkali-soluble groups well known in this field of art are exemplified. Specifically, a carboxylic acid group, a sulfonic acid group, a phenol group, and a thiol group are exemplified, preferably a carboxylic acid group and a sulfonic acid group.

The alkali-soluble group protected by the structure represented by formula (pI), (pII), (pIII), (pIV), (pV) or (pVI) includes the groups represented by the following formula (pVII), (pVIII), (pIX), (pX) or (pXI):

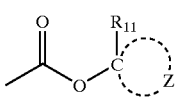 (pVII)

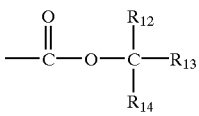 (pVIII)

-continued (pIX)

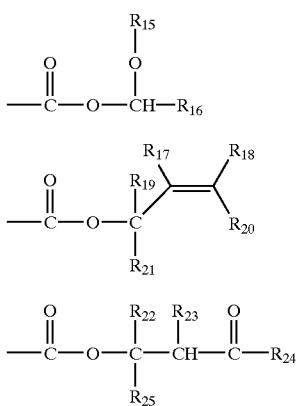

(pX)

(pXI)

In formulae (pVII), (pVIII), (pIX), (pX) and (pXI), $R_{11}$ to $R_{25}$ and Z each has the same meaning as defined above.

The repeating unit having an alkali-soluble group protected with the structure represented by formula (pI), (pII), (pIII), (pIV), (pV) or (pVI) constituting resin (B) is preferably represented by the following formula (pA):

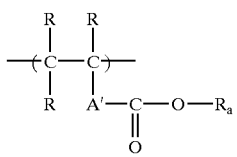

(pA)

wherein R represents a hydrogen atom, a halogen atom, or a substituted or unsubstituted, straight chain or branched alkyl group having from 1 to 4 carbon atoms. A plurality of R's may be the same or different. The halogen atom and the alkyl group represented by R has the same meaning as those in formula (a) described above.

A' has the same meaning as described above.

$R_a$ represents any group represented by formula (pI), (pII), (pIII), (pIV), (pV) or (pVI).

The specific examples of the monomers corresponding to the repeating unit represented by formula (pA) are shown below.

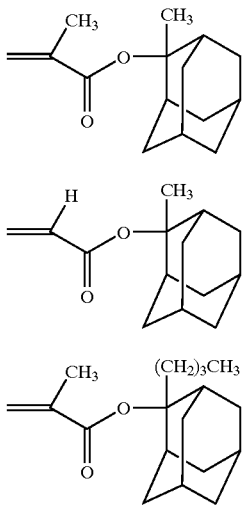

1

2

3

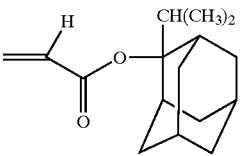

4

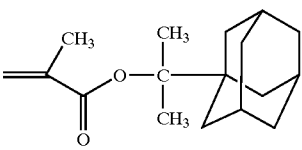

5

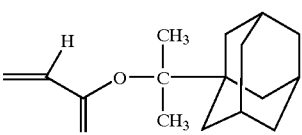

6

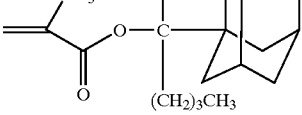

7

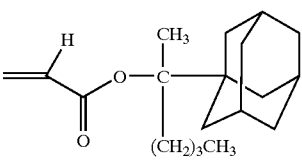

8

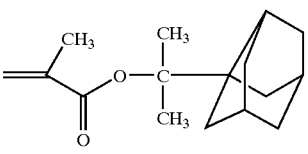

9

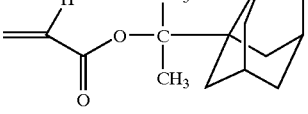

10

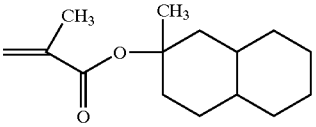

11

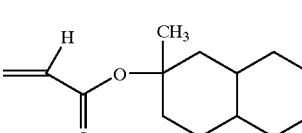

12

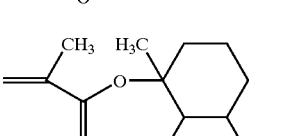

13

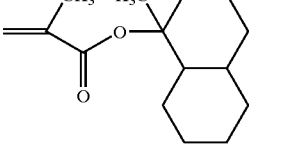

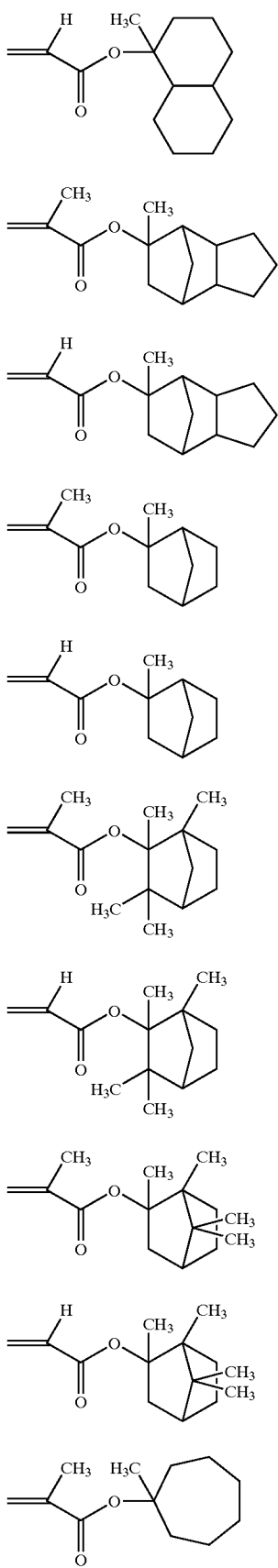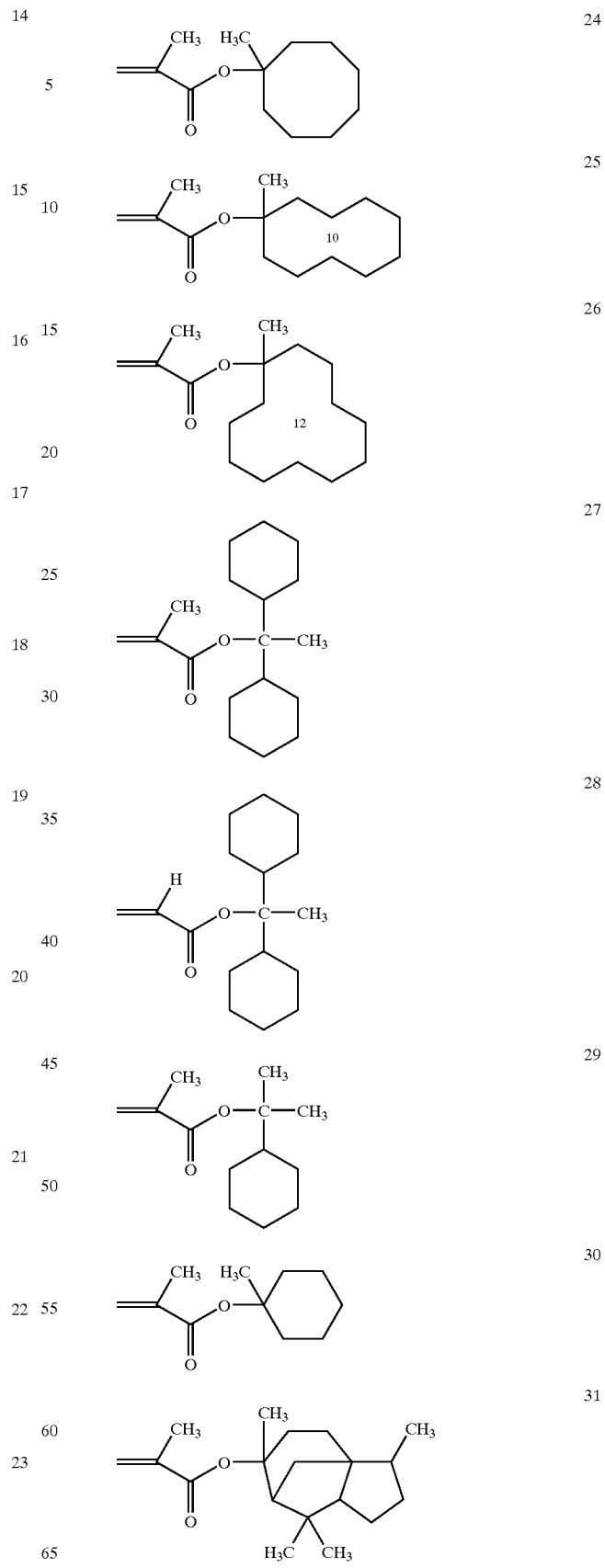

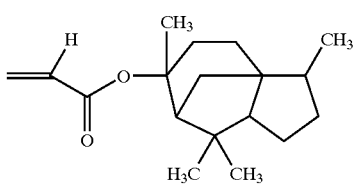
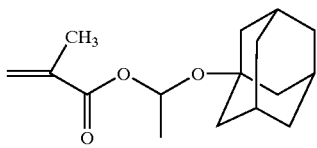
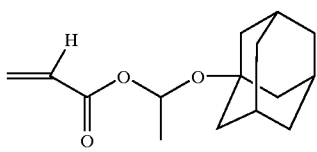
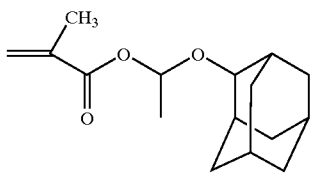
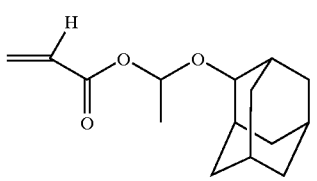
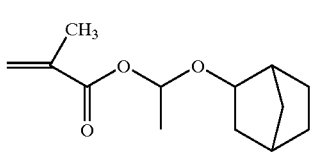
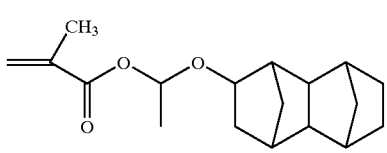
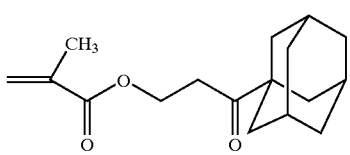
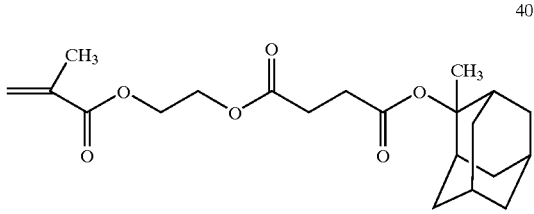

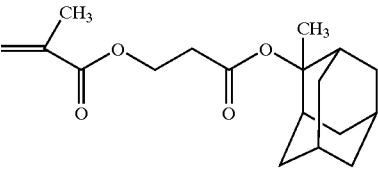

Resin (B) may further contain other repeating unit.

It is preferred for resin (B) to contain a repeating unit represented by the above formula (a) as other copolymer component. The developability and the adhesion with a substrate are improved by containing a repeating unit represented by formula (a). The alkyl group represented by R in formula (a) which may have a substituent has the same meaning as $R_1$ in formulae (I-1) to (I-4). The halogen atom represented by R are a fluorine atom, a chlorine atom, a bromine atom or an iodine atom. At least one of $R_{32}$, $R_{33}$ and $R_{34}$ in formula (a) represents a hydroxyl group, preferably a dihydroxyl group or a monohydroxyl group, and more preferably a monohydroxyl group.

Further, it is preferred that resin (B) in the present invention contains a repeating unit represented by the following formula (III-a), (III-b), (III-c) or (III-d) as other copolymer component, by which the definition of contact hole pattern is improved.

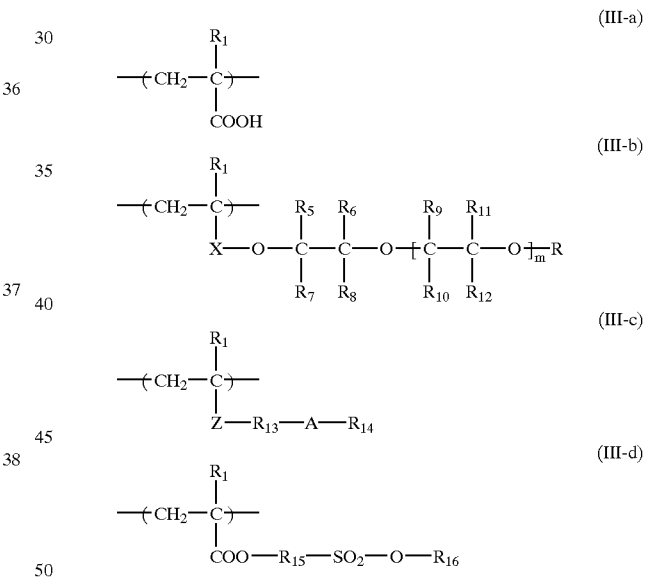

wherein $R_1$ has the same meaning as the above-described R; $R_5$, $R_6$, $R_7$, $R_8$, $R_9$, $R_{10}$, $R_{11}$ and $R_{12}$ each represents a hydrogen atom or an alkyl group which may have a substituent; R represents a hydrogen atom, a substituted or unsubstituted alkyl group, a substituted or unsubstituted cyclic alkyl group, a substituted or unsubstituted aryl group, or a substituted or unsubstituted aralkyl group; m represents an integer of from 1 to 10; and X represents a single bond, or a divalent group obtained by combining alone or two or more groups selected from the group consisting of a substituted or unsubstituted alkylene group, a substituted or unsubstituted cyclic alkylene group, a substituted or unsubstituted arylene group, an ether group, a thioether group, a carbonyl group, an ester group, an amido group, a sulfonamido group, a urethane group and a urea group, and X does not decompose by the action of an acid.

Z represents a single bond, an ether group, an ester group, an amido group, an alkylene group, or a divalent group obtained by combining these groups. $R_{13}$ represents a single bond, an alkylene group, an arylene group, or a divalent group obtained by combining these groups. $R_{15}$ represents an alkylene group, an arylene group or a divalent group obtained by combining these groups. $R_{14}$ represents a substituted or unsubstituted aralkyl group, a substituted or unsubstituted cyclic alkyl group, a substituted or unsubstituted aryl group, or a substituted or unsubstituted aralkyl group. $R_{16}$ represents a hydrogen atom, a substituted or unsubstituted alkyl group, a substituted or unsubstituted cyclic alkyl group, a substituted or unsubstituted alkenyl group, a substituted or unsubstituted aryl group, or a substituted or unsubstituted aralkyl group.

A represents any functional group shown below.

—CO—NH—SO$_2$—
—SO$_2$—NH—CO—
—NH—CO—NH—SO$_2$—
—SO$_2$—NH—CO—NH—
—O—CO—NH—SO$_2$—
—SO$_2$—NH—CO—O—
—SO$_2$—NH—SO$_2$—

The alkyl group represented by $R_5$, $R_6$, $R_7$, $R_8$, $R_9$, $R_{10}$, $R_{11}$, $R_{12}$, R, $R_{14}$ and $R_{16}$ is a straight chain or branched alkyl group which may have a substituent. The straight chain or branched alkyl group is preferably a straight chain or branched alkyl group having from 1 to 12 carbon atoms, more preferably a straight chain or branched alkyl group having from 1 to 10 carbon atoms, and still more preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group, or a decyl group.

The cycloalkyl group represented by R, $R_{14}$ and $R_{16}$ is a cycloalkyl group having from 3 to 30 carbon atoms, specifically a cyclopropyl group, a cyclopentyl group, a cyclohexyl group, an adamantyl group, a norbornyl group, a boronyl group, a tricyclodecanyl group, a dicyclopentenyl group, a norbornane-epoxy group, a menthyl group, an isomenthyl group, a neomenthyl group, a tetracyclododecanyl group and a steroid residue can be exemplified.

The aryl group represented by R, $R_{14}$ and $R_{16}$ is an aryl group having from 6 to 20 carbon atoms which may have a substituent, specifically a phenyl group, a tolyl group and a naphthyl group can be exemplified.

The aralkyl group represented by R, $R_{14}$ and $R_{16}$ is an aralkyl group having from 7 to 20 carbon atoms, e.g., a substituted or unsubstituted benzyl group, a substituted or unsubstituted phenethyl group, and a substituted or unsubstituted cumyl group can be exemplified. The alkenyl group represented by $R_{16}$ is an alkenyl group having from 2 to 6 carbon atoms, specifically a vinyl group, a propenyl group, an allyl group, a butenyl group, a pentenyl group, a hexenyl group, a cyclopentenyl group, a cyclohexenyl group, a 3-oxocyclohexenyl group, a 3-oxocyclopentenyl group and a 3-oxoindenyl group can be exemplified. Of these groups, cyclic alkenyl groups may contain an oxygen atom.

Linking group X represents a divalent group obtained by combining alone or two or more groups selected from the group consisting of a substituted or unsubstituted alkylene group, a substituted or unsubstituted cyclic alkylene group, a substituted or unsubstituted arylene group, an ether group, a thioether group, a carbonyl group, an ester group, an amido group, a sulfonamido group, a urethane group and a urea group, and X does not decompose by the action of an acid.

Z represents a single bond, an ether group, an ester group, an amido group, an alkylene group, or a divalent group obtained by combining these groups. $R_{13}$ represents a single bond, an alkylene group, an arylene group, or a divalent group obtained by combining these groups. $R_{15}$ represents an alkylene group, an arylene group or a divalent group obtained by combining these groups.

The arylene group represented by X, $R_{13}$ and $R_{15}$ is an arylene group having from 6 to 10 carbon atoms which may have a substituent, specifically a phenylene group, a tolylene group and a naphthylene group can be exemplified.

As the cyclic alkylene group represented by X, a divalent group derived from the cyclic alkyl group can be exemplified.

The alkylene group represented by X, Z, $R_{13}$ and $R_{15}$ is a group represented by the following formula:

wherein $R_a$ and $R_b$, which may be the same or different, each represents a hydrogen atom, an alkyl group, a substituted alkyl group, a halogen atom, a hydroxyl group or an alkoxyl group. The alkyl group is preferably a lower alkyl group, e.g., a methyl group, an ethyl group, a propyl group, an isopropyl group, or a butyl group, more preferably a methyl group, an ethyl group, a propyl group, or an isopropyl group. The examples of the substituents for the substituted alkyl group include a hydroxyl group, a halogen atom, and an alkoxyl group. The alkoxyl group is an alkoxyl group having from 1 to 4 carbon atoms, e.g., a methoxy group, an ethoxy group, a propoxy group or a butoxy group. The examples of the halogen atoms include a chlorine atom, a bromine atom, a fluorine atom and an iodine atom. r1 represents an integer of from 1 to 10.

The specific examples of the linking group X are shown below, however they should not be construed as limiting the scope of the present invention.

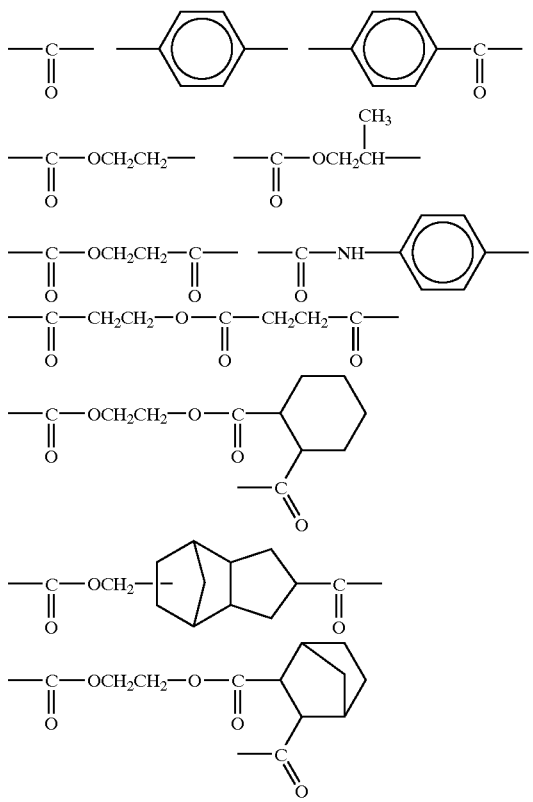

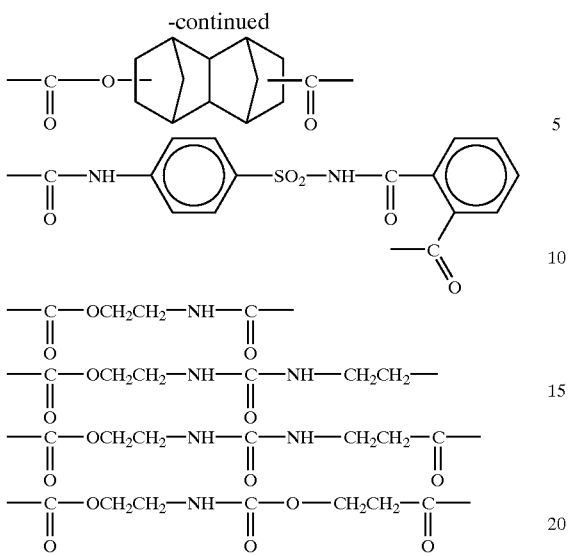

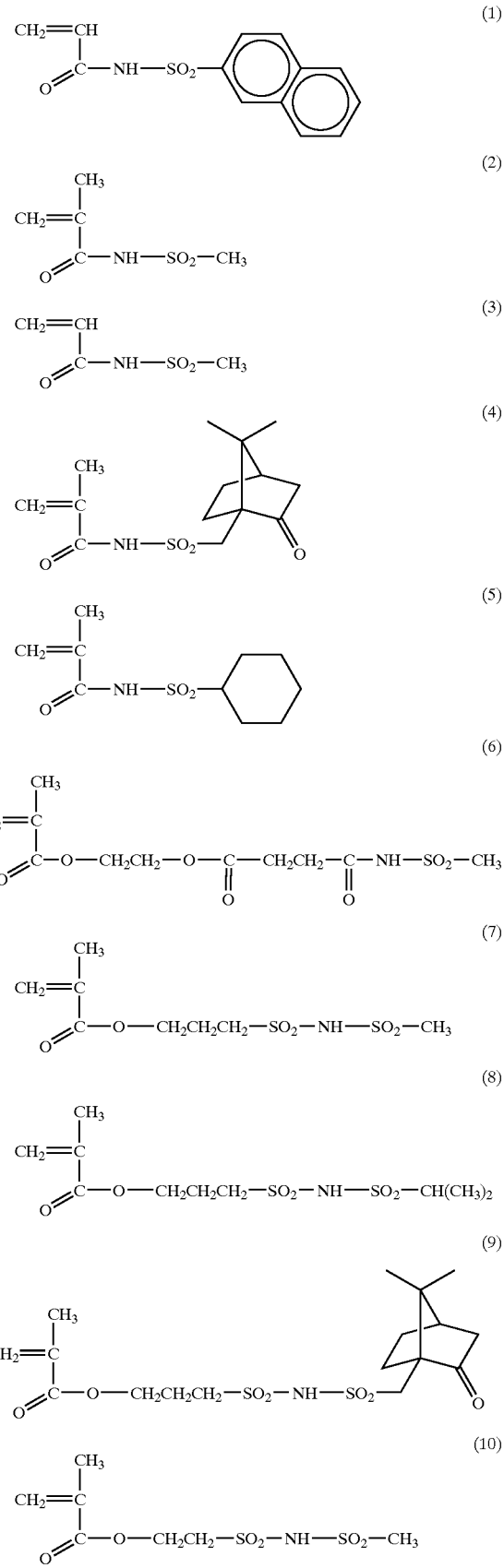

The examples of substituents of the substituted alkyl, cyclic alkyl, alkenyl, aryl, aralkyl, alkylene, cyclic alkylene and arylene groups include a carboxyl group, an acyloxy group, a cyano group, an alkyl group, a substituted alkyl group, a halogen atom, a hydroxyl group, an alkoxyl group, an acetylamido group, an alkoxycarbonyl group and an acyl group. The alkyl group is a lower alkyl group, e.g., a methyl group, an ethyl group, a propyl group, an isopropyl group, a butyl group, a cyclopropyl group, a cyclobutyl group and a cyclopentyl group can be exemplified. The substituents of the substituted alkyl group include a hydroxyl group, a halogen atom and an alkoxyl group. As the alkoxyl group, an alkoxyl group having from 1 to 4 carbon atoms, e.g., a methoxy group, an ethoxy group, a propoxy group and a butoxy group can be exemplified. As the acyloxy group, an acetoxy group can be exemplified. The examples of the halogen atoms include a chlorine atom, a bromine atom, a fluorine atom and an iodine atom.

As the specific examples of the side chain structures in formula (III-b), the specific examples of terminal structures excluding X are shown below, however, they should not be construed as limiting the scope of the present invention.

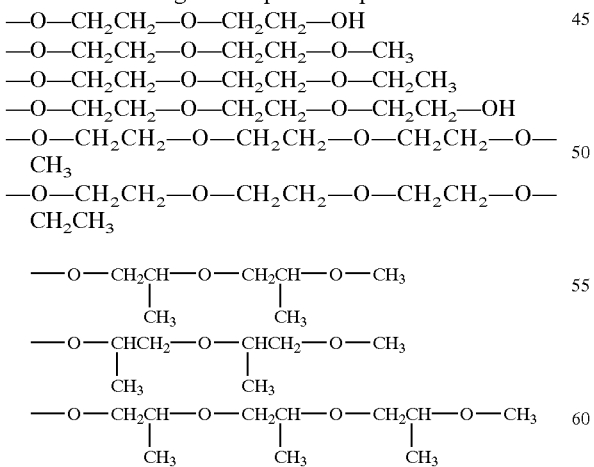

The specific examples of the monomers corresponding to the repeating structural unit represented by formula (III-c) are shown below, however, these compounds should not be construed as limiting the scope of the present invention.

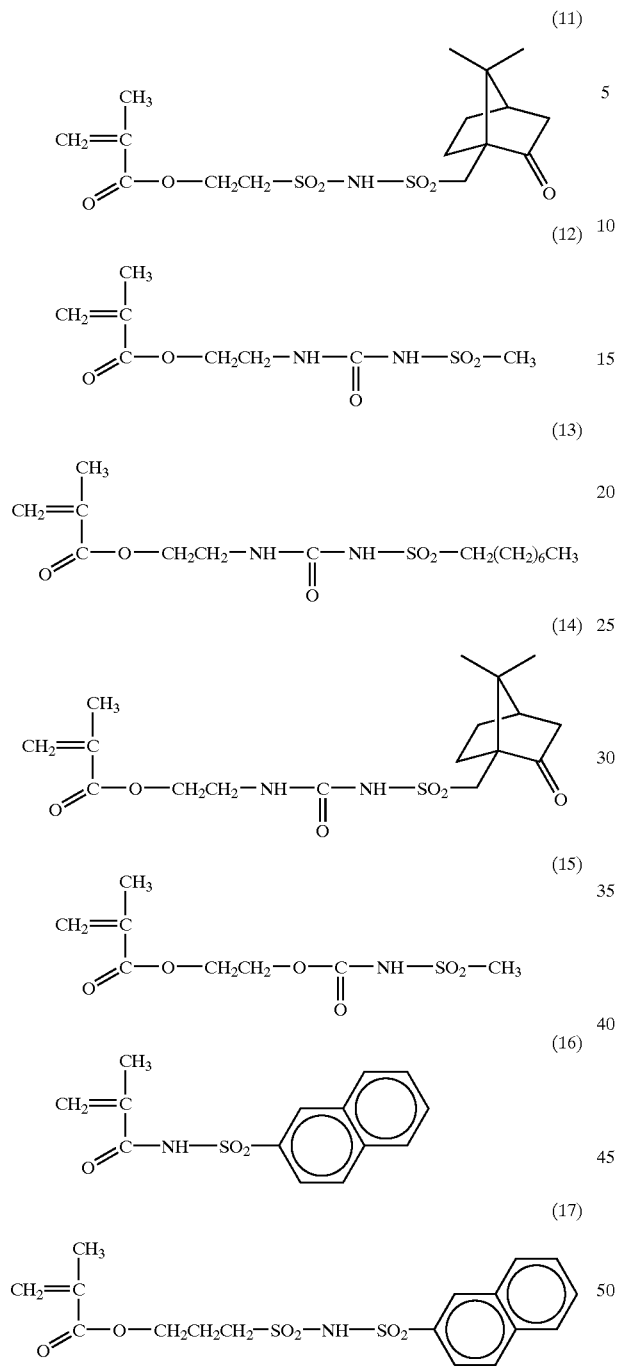
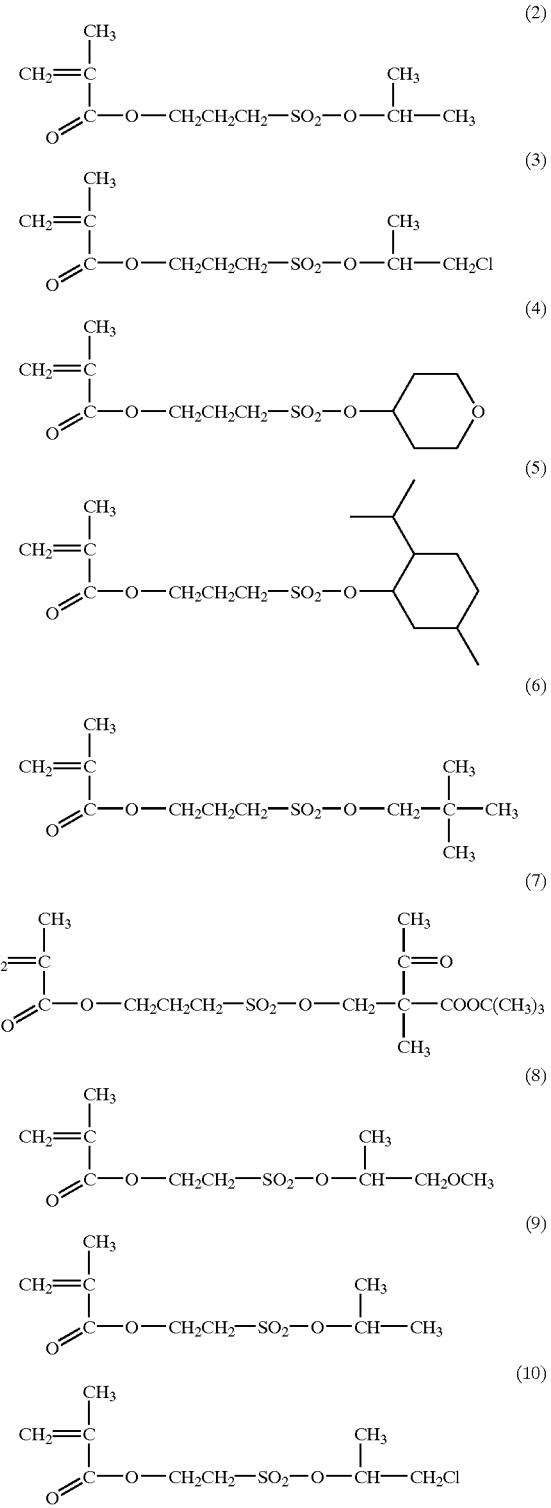
The specific examples of the repeating structural unit represented by formula (III-d) are shown below, however, these compounds should not be construed as limiting the scope of the present invention.
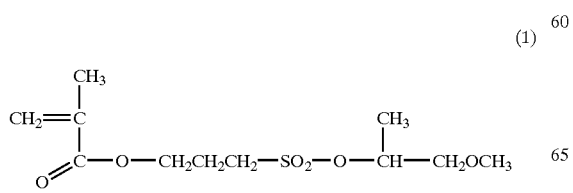
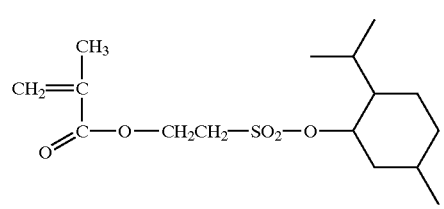

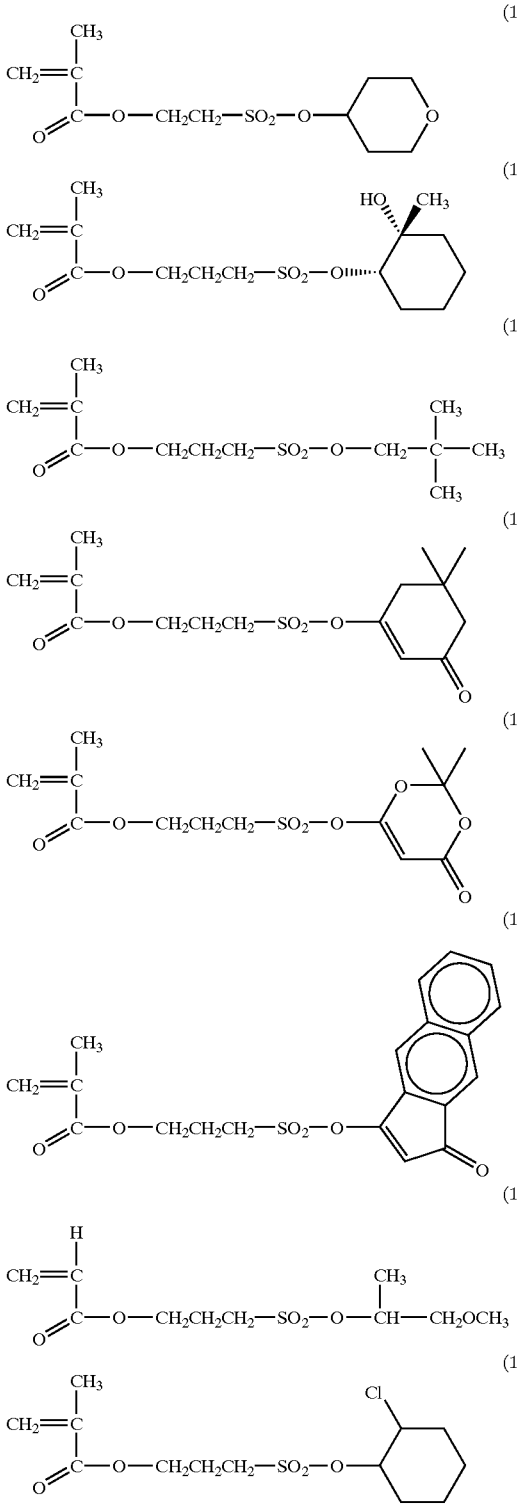

erably represents an alkyl group having from 1 to 10 carbon atoms, e.g., a methyl group and an ethyl group, a cyclic alkyl group, e.g., a cyclopropyl group, a cyclohexyl group and a camphor residue, a naphthyl group or a naphthylmethyl group; and Z preferably represents a single bond, an ether bond, an ester bond, an alkylene group having from 1 to 6 carbon atoms, or a combination of these groups, and more preferably a single bond or an ester bond.

In formula (III-d), $R_{15}$ preferably represents an alkylene group having from 1 to 4 carbon atoms; $R_{16}$ preferably represents an alkyl group having from 1 to 8 carbon atoms which may have a substituent, e.g., a methyl group, an ethyl group, a propyl group, an isopropyl group, a butyl group, a neopentyl group or an octyl group, or a cyclohexyl group, an adamantyl group, a norbornyl group, a boronyl group, an isoboronyl group, a menthyl group, a morpholino group or a 4-oxocyclohexyl group, or a substituted or unsubstituted phenyl group, toluyl group, mesityl group, naphthyl group or camphor residue. As further substituents of these groups, a halogen atom, e.g., a fluorine atom, and an alkoxyl group having from 1 to 4 carbon atoms are preferably used.

Of the repeating units represented by formulae (III-a), (III-b), (III-c) and (III-d), the repeating unit represented by formula (III-b) or (III-d) is preferably used in the present invention.

Resin (B) can be used as copolymers with various monomer repeating units for the purpose of adjusting dry etching resistance, the aptitude for a standard developing solution, adhesion to a substrate, resist profile, and general indispensable requisites of the resist, e.g., definition, heat resistance and sensitivity, besides the above descriptions.

As such repeating units, the repeating units corresponding to the monomers shown below can be exemplified but the present invention is not limited thereto.

Due to containing these monomers, it becomes possible to finely adjust the characteristics required of resin (B), in particular, the characteristics of (1) solubility in a coating solvent, (2) film-forming property (glass transition point), (3) alkali developability, (4) film decrease (hydrophilicity/hydrophobicity, selection of alkali-soluble groups), (5) adhesion to the substrate of an unexposed area, and (6) dry etching resistance can be finely adjusted.

As such monomers, compounds having one addition polymerizable unsaturated bond selected from, e.g., acrylic esters, methacrylic esters, acrylamides, methacrylamides, allyl compounds, vinyl ethers and vinyl esters can be exemplified.

Specifically, the following monomers can be exemplified.

Acrylic Esters (Preferably an Alkyl Acrylate, Wherein the Alkyl Group has From 1 to 10 the Carbon Atoms)

methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate.

Methacrylic Esters (Preferably an Akyl Methacrylate, Wherein the Alkyl Group has From 1 to 10 the Carbon Atoms)

methyl methacrylate, ethyl methacrylate, propyl methacrylate, isopropyl methacrylate, amyl methacrylate, In formula (III-b), $R_5$, $R_6$, $R_7$, $R_8$, $R_9$, $R_{10}$, $R_{11}$ and $R_{12}$ each preferably represents a hydrogen atom or a methyl group; R preferably represents a hydrogen atom, or an alkyl group having from 1 to 4 carbon atoms; and m preferably represents an integer of from 1 to 6.

In formula (III-c), $R_{13}$ preferably represents a single bond, or an alkylene group, e.g., a methylene group, an ethylene group, a propylene group and a butylene group; $R_{14}$ prefhexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate.

Acrylamides acrylamide, N-alkylacrylamide (as the alkyl group, an alkyl group having from 1 to 10 carbon atoms, e.g., methyl, ethyl, propyl, butyl, t-butyl, heptyl, octyl, cyclohexyl, and hydroxyethyl), N,N-dialkylacrylamide (as the alkyl group, an alkyl group having from 1 to 10 carbon atoms, e.g., methyl, ethyl, butyl, isobutyl, ethylhexyl, and cyclohexyl), N-hydroxyethyl-N-methylacrylamide, and N-2-acetamidoethyl-N-acetylacrylamide.

Methacrylamides methacrylamide, N-alkylmethacrylamide (as the alkyl group, an alkyl group having from 1 to 10 carbon atoms, e.g., methyl, ethyl, t-butyl, ethylhexyl, hydroxyethyl, and cyclohexyl), N,N-dialkylmethacrylamide (as the alkyl group, e.g., ethyl, propyl and butyl), and N-hydroxyethyl-N-methylmethacrylamide.

Allyl Compounds allyl esters (e.g., allyl acetate, allyl caproate, allyl caprylate, allyl laurate, allylpalmitate, allyl stearate, allyl benzoate, allyl acetoacetate and allyl lactate), and allyloxyethanol.

Vinyl Ethers alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether).

Vinyl Esters vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl acetoacetate, vinyl lactate, vinyl-β-phenylbutyrate, and vinyl cyclohexylcarboxylate.

Dialkyl Itaconates dimethyl itaconate, diethyl itaconate, and dibutyl itaconate.

Dialkyl Esters or Monoalkyl Esters of Fumaric Acid dibutyl fumarate.

Others acrylic acid, methacrylic acid, crotonic acid, itaconic acid, maleic anhydride, maleimide, acrylonitrile, methacrylonitrile, and maleylonitrile.

Besides the above compounds, addition polymerizable unsaturated compounds copolymerizable with the above various repeating structural units can be used.

In resin (B), the content molar ratio of each repeating structural unit is arbitrarily set for adjusting an acid value, dry etching resistance of a resist, the aptitude for a standard developing solution, adhesion to a substrate, pitch dependency of resist profile, and general indispensable requisites of the resist, e.g., definition, heat resistance and sensitivity.

The content of the repeating unit having a group represented by formula (I-1), (I-2), (I-3) or (I-4) in resin (B) is generally from 30 to 70 mol % in the entire repeating units, preferably from 35 to 65 mol %, and more preferably from 40 to 60 mol %.

The content of the repeating unit having a group represented by formula (pI), (pII), (pIII), (pIV), (pV) or (pVI) in resin (B) is generally from 20 to 75 mol % in the entire repeating units, preferably from 20 to 75 mol %, and more preferably from 30 to 65 mol %.

The content of the repeating unit represented by formula (a) in resin (B) is generally from 0 to 70 mol % in the entire monomer repeating units, preferably from 10 to 40 mol %, and more preferably from 15 to 30 mol %.

The content of the repeating unit represented by formula (III-a), (III-b), (III-c) or (III-d) in resin (B) is generally from 0.1 to 30 mol % in the entire monomer repeating units, preferably from 0.5 to 25 mol %, and more preferably from 1 to 20 mol %.

The content of the repeating units comprising other copolymerizable component monomers in resin (B) can also be arbitrarily set according to the characteristics of a desired resist, but the content is generally preferably 99 mol % or less of the total mol number of the repeating unit having a group represented by formula (I-1), (I-2), (I-3) or (I-4) and the repeating unit having a group represented by formula (pI), (pII), (pIII), (pIV), (pV) or (pVI), more preferably 90 mol % or less, and still more preferably 80 mol % or less.

The weight average molecular weight (Mw) of resin (B) measured by gel permeation chromatography and calculated in terms of polystyrene standard is preferably from 1,000 to 1,000,000, more preferably from 1,500 to 500,000, still more preferably from 2,000 to 200,000, and particularly preferably from 2,500 to 100,000. The higher the weight average molecular weight, the higher is the heat resistance, while developability lowers, thus the weight average molecular weight is adjusted to a preferred range so that these characteristics are well-balanced.

Resin (B) for use in the present invention can be synthesized according to ordinary methods, e.g., radical polymerization.

The specific examples of resin (B) according to the present invention are shown below, however, these resins should not be construed as limiting the scope of the present invention.

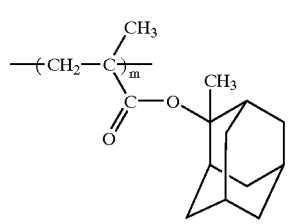
(1)

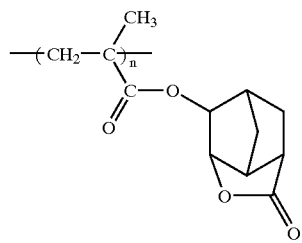
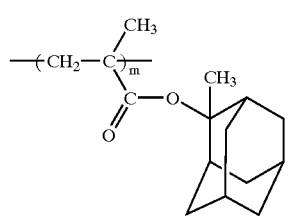
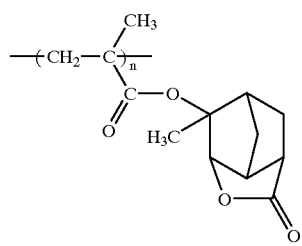
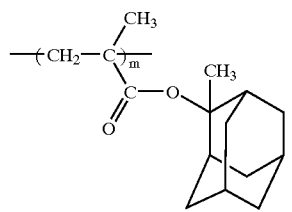
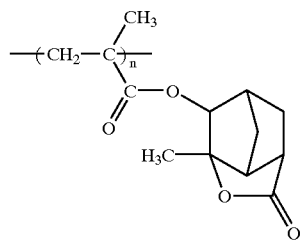
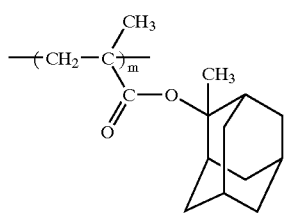
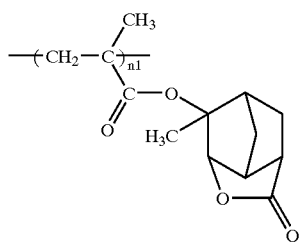
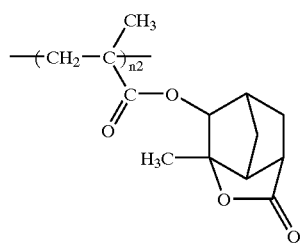
(2)
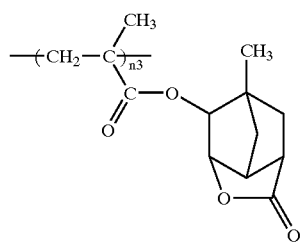
(3)
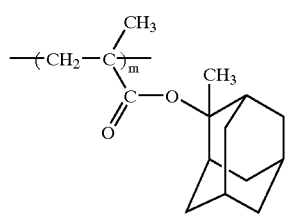
(4)
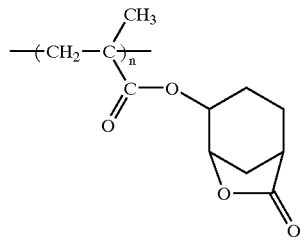
(5)
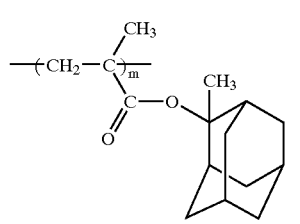
(6)
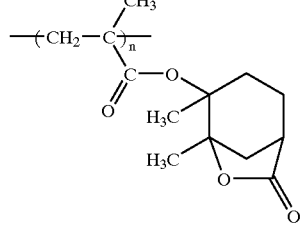
(7)
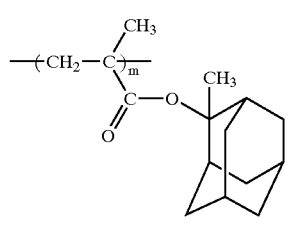

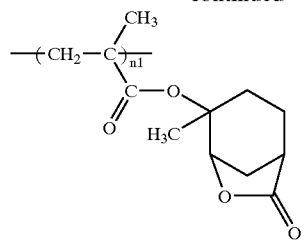
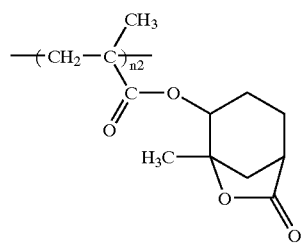
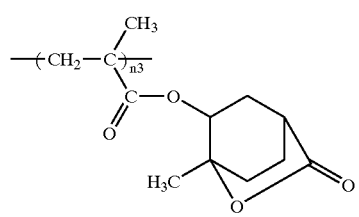
(8)
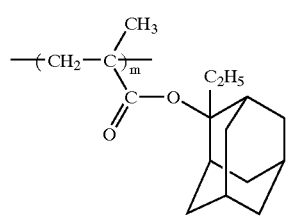
(9)
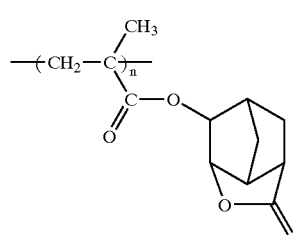
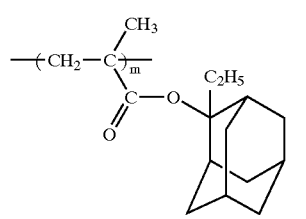
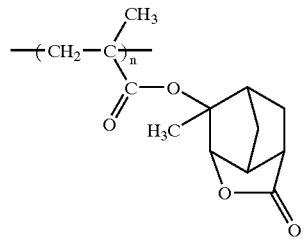
(10)
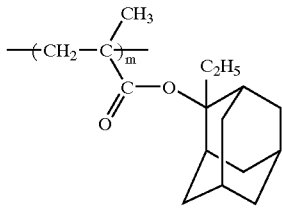
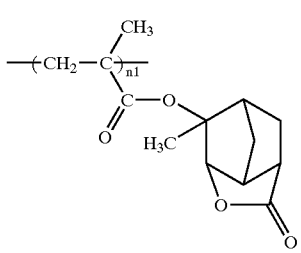
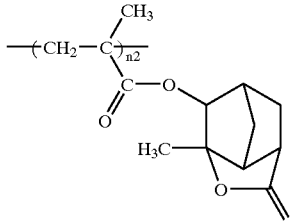
(11)
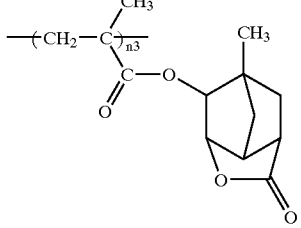
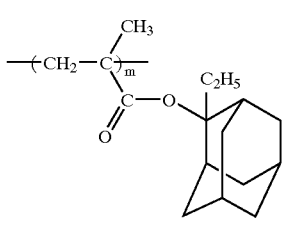
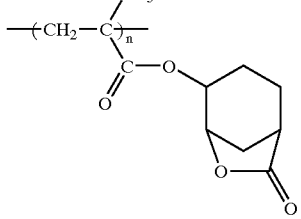
(12)
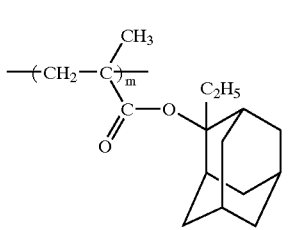

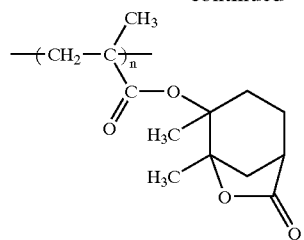
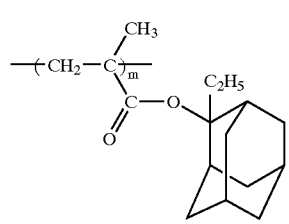
(13)
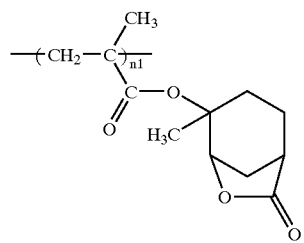
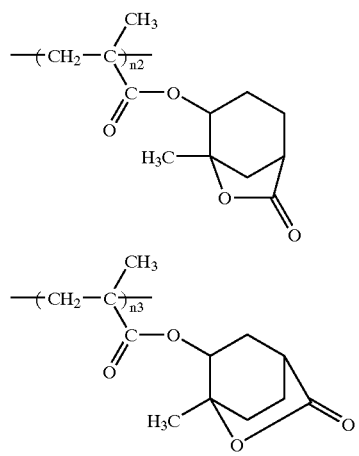
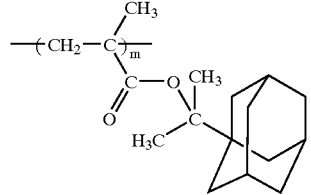
(14)
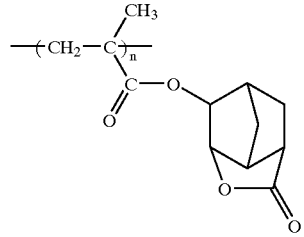
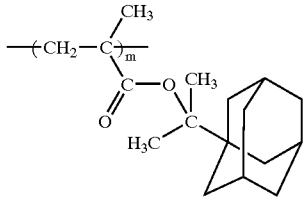
(15)
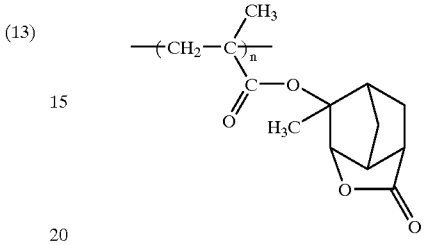
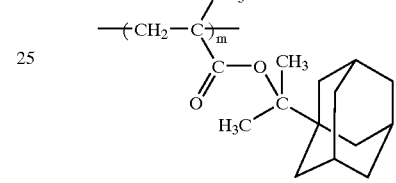
(16)
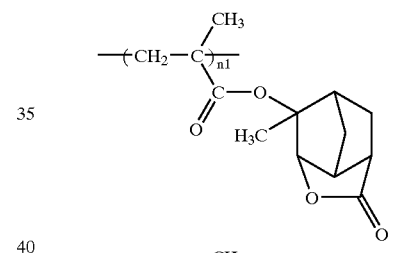
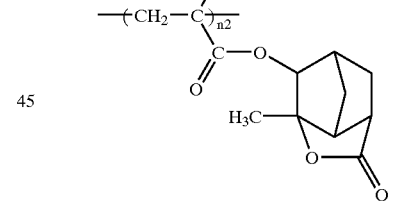
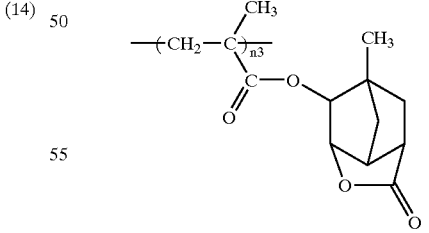
(17)
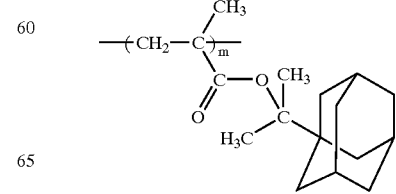

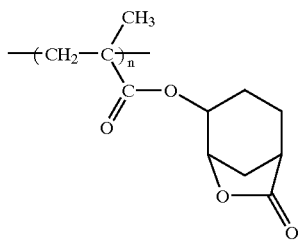
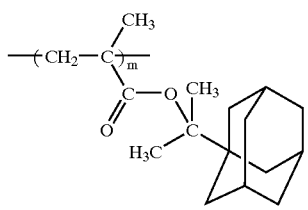
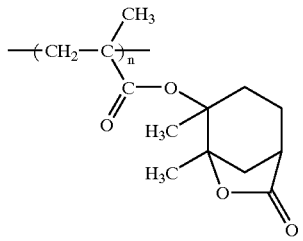
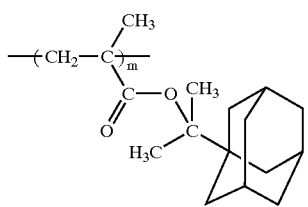
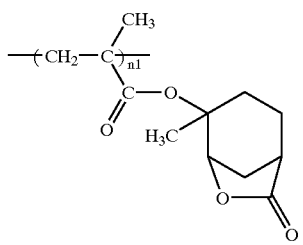
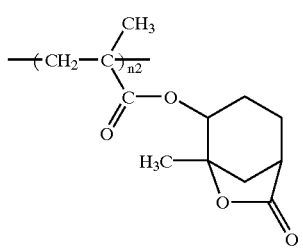
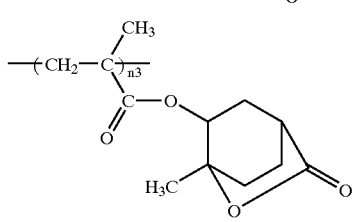
(18)
(19)
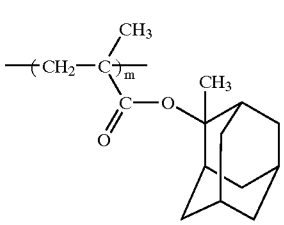
(20)
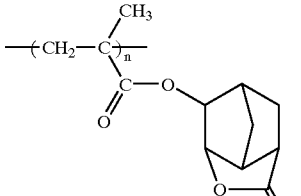
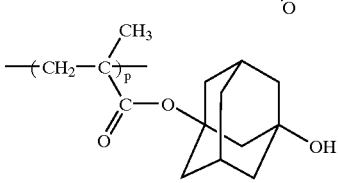
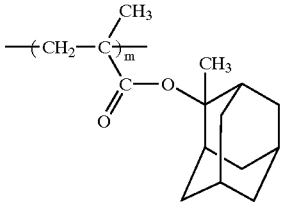
(21)
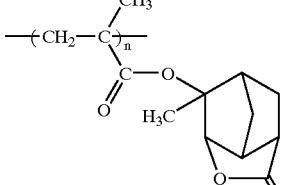
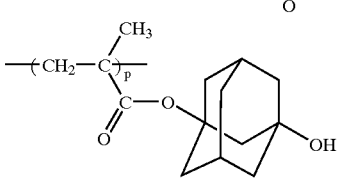
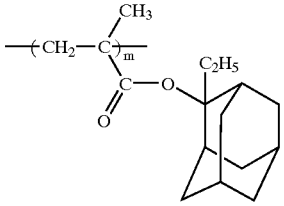
(22)
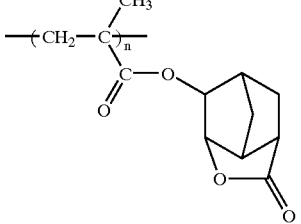

-continued
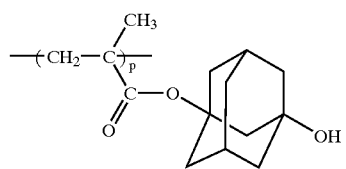
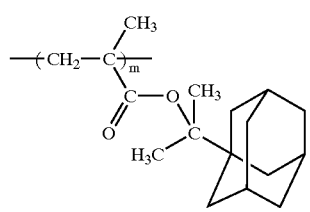
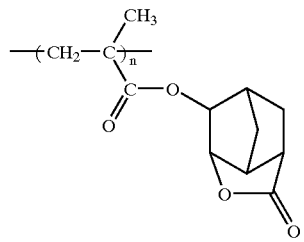
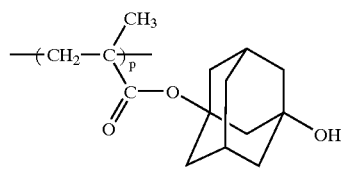
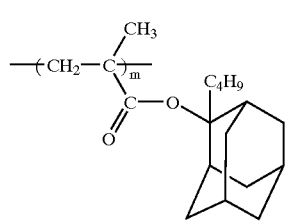
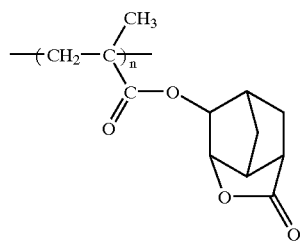
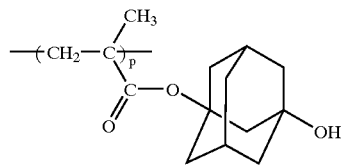
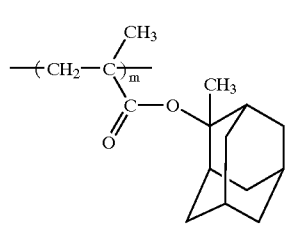
-continued
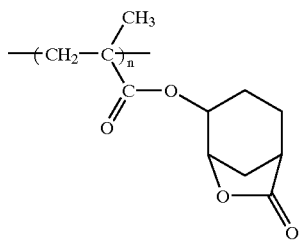
(23)
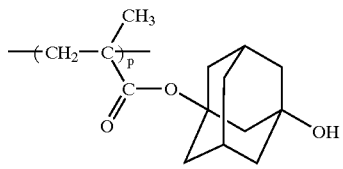
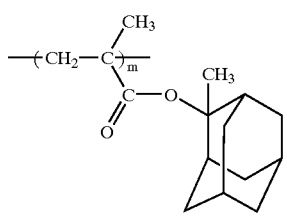
(24)
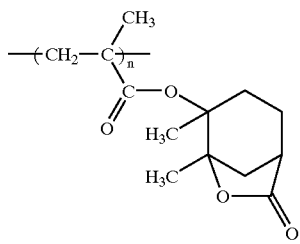
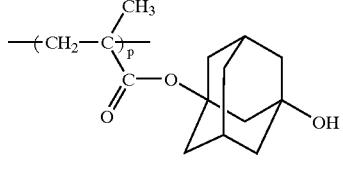
(25)
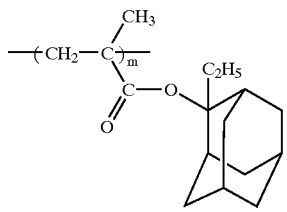
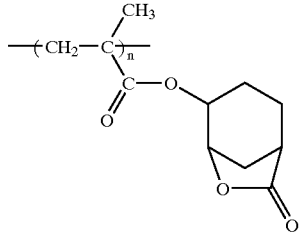
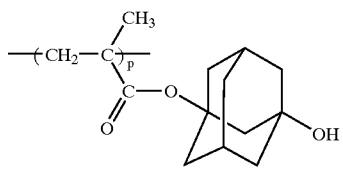
(26)
(27)

(28)
(29)
(30)
(31)
(32)
(33)
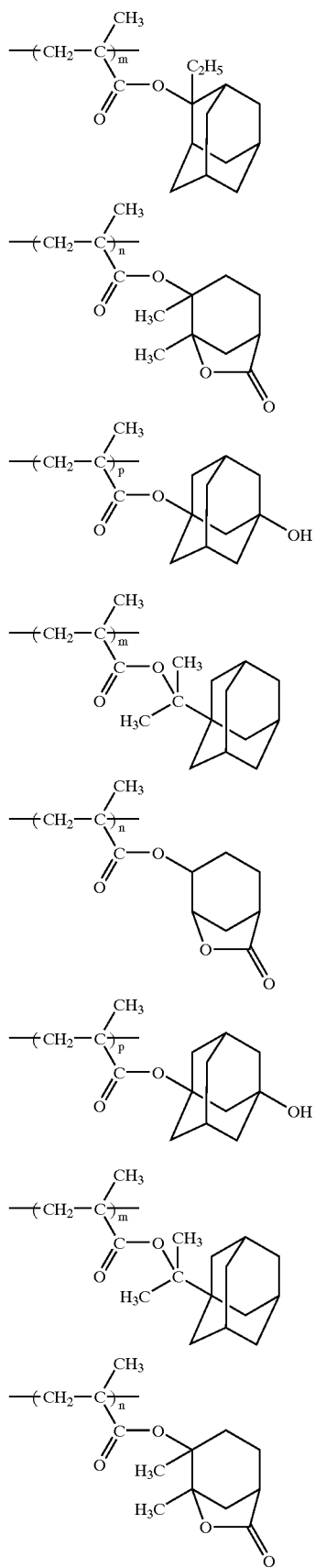
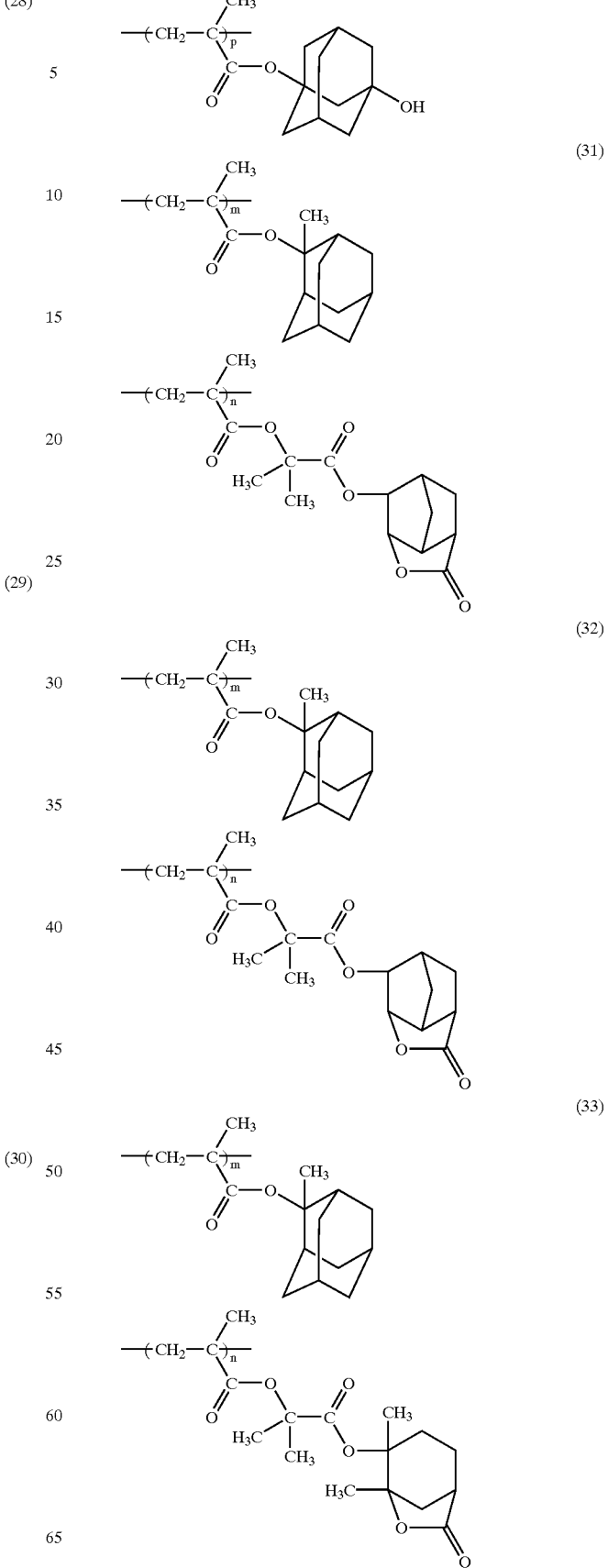

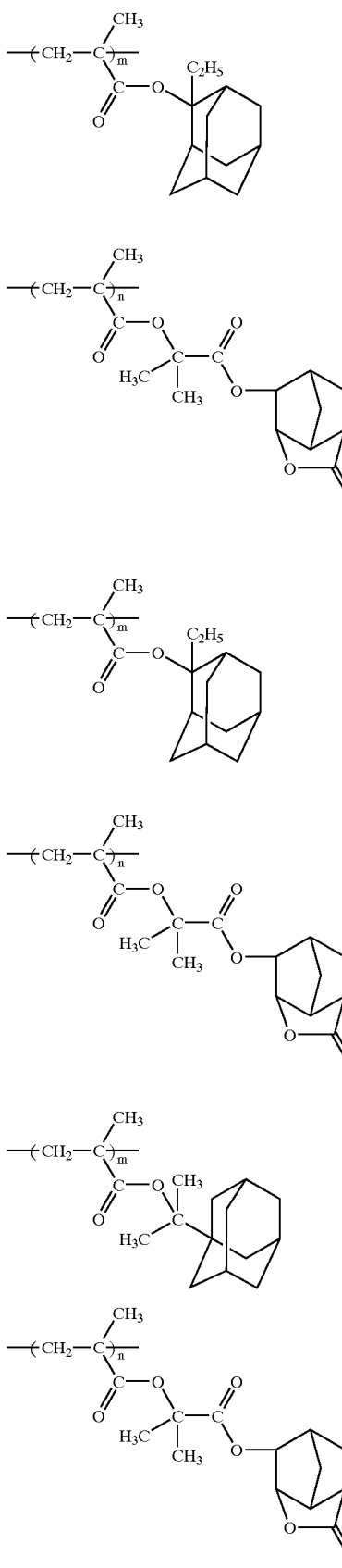
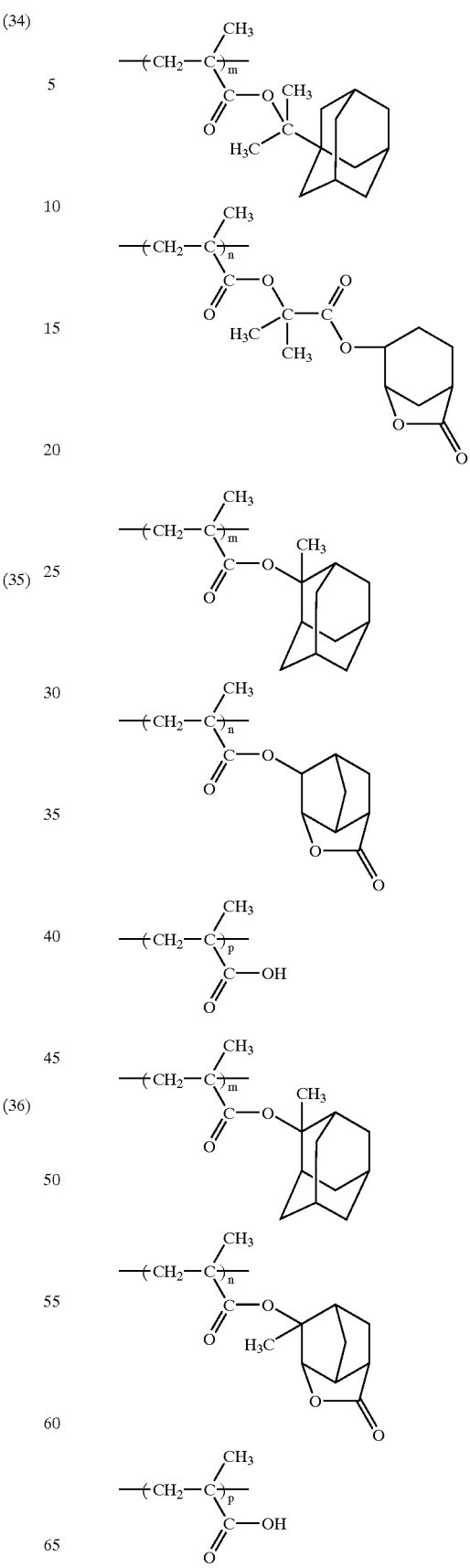

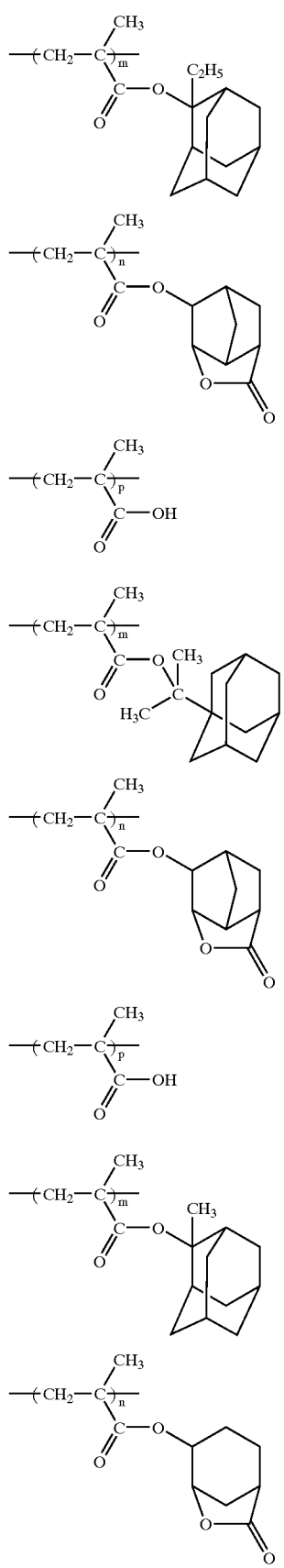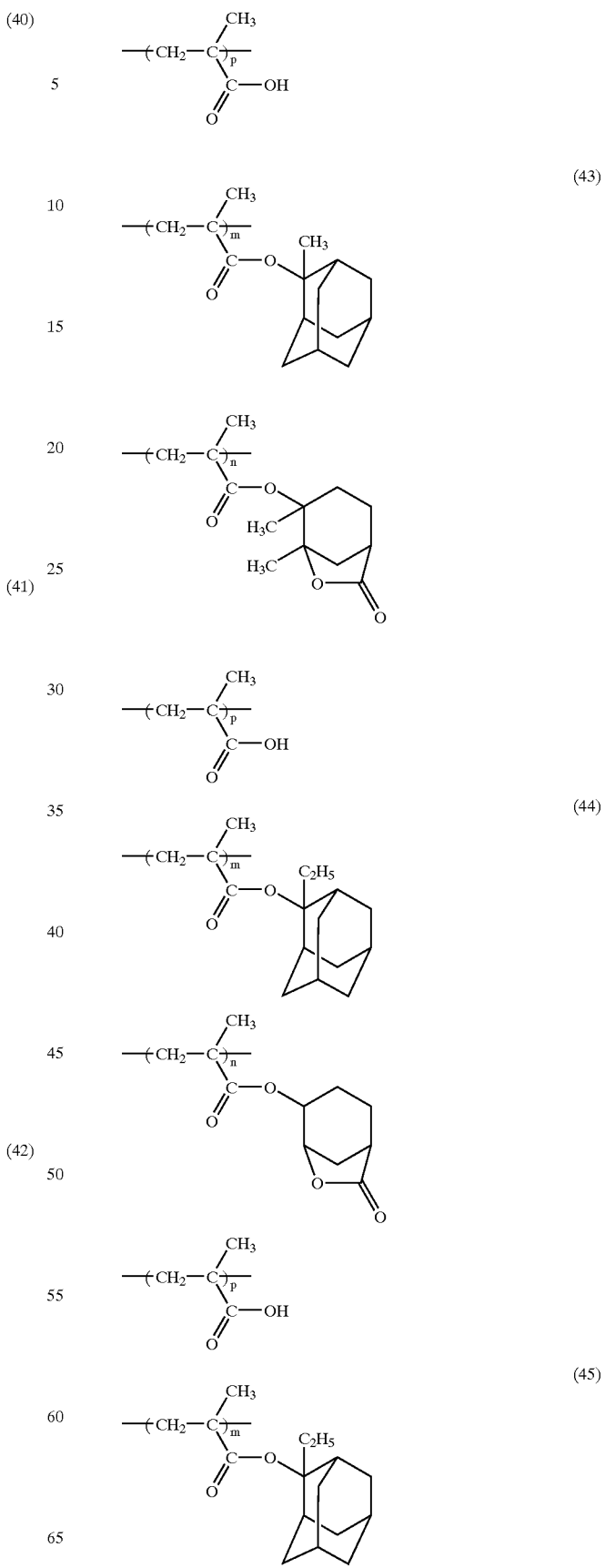

-continued
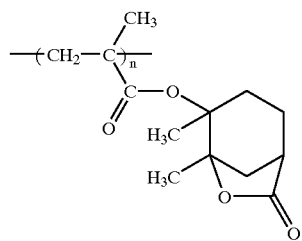
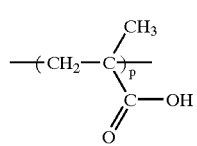
(46)
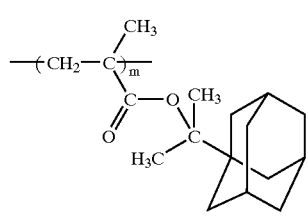
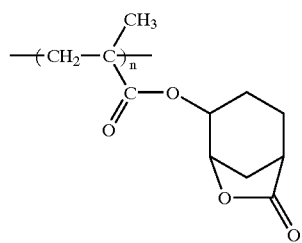
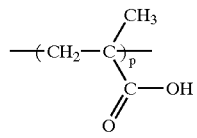
(47)
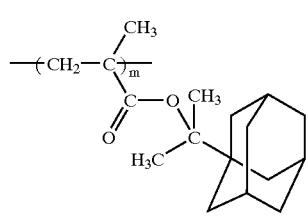
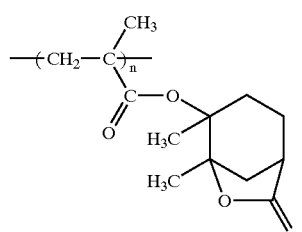
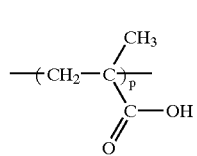
-continued
(48)
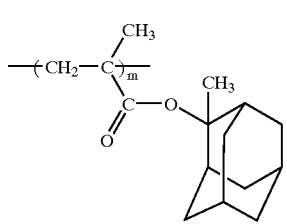
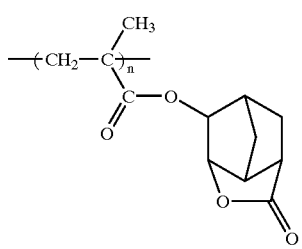
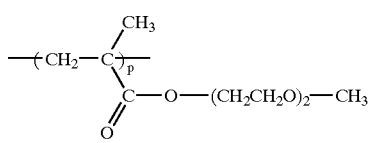
(49)
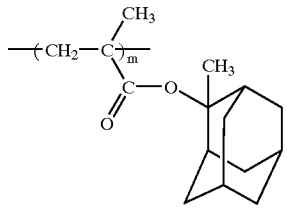
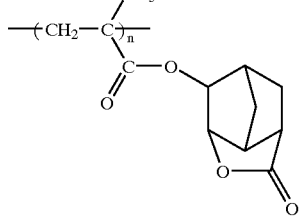
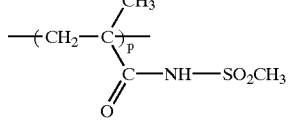
(50)
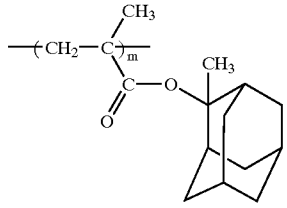
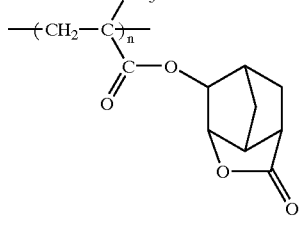

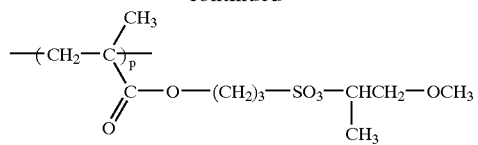
(51)
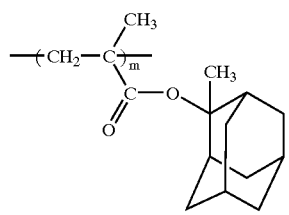
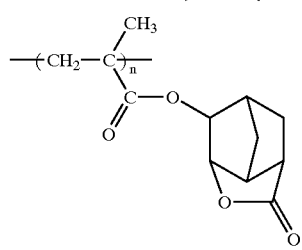
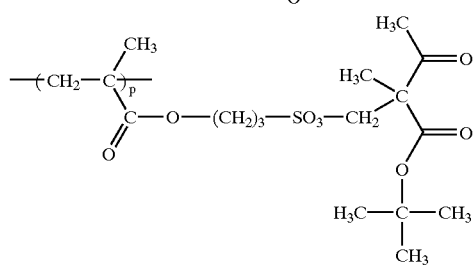
(52)
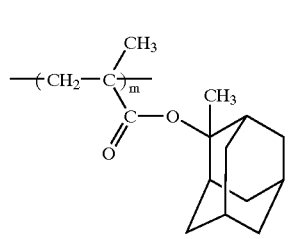
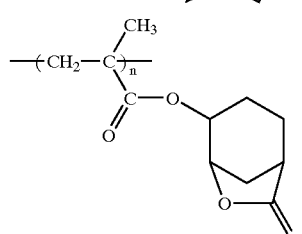
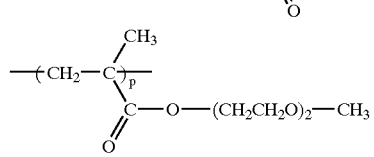
(53)
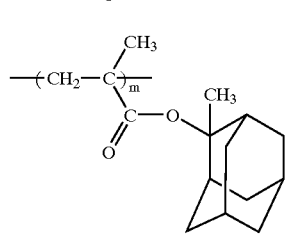
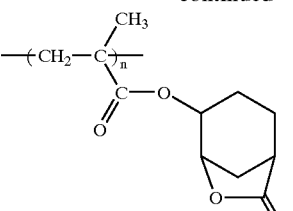
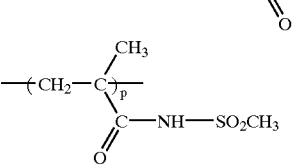
(54)
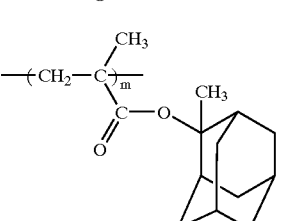
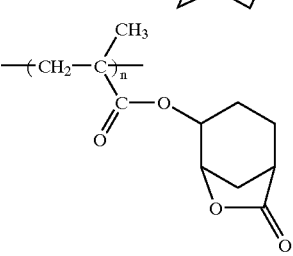
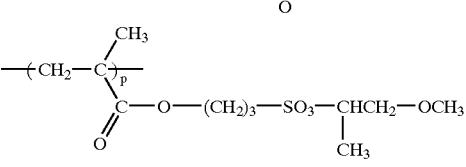
(55)
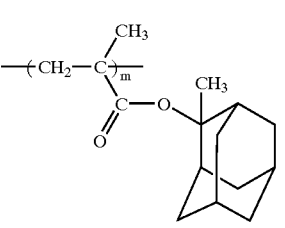
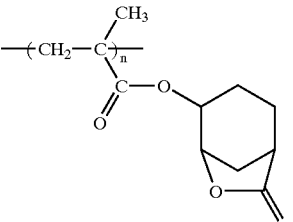
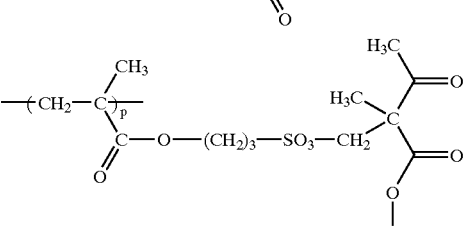

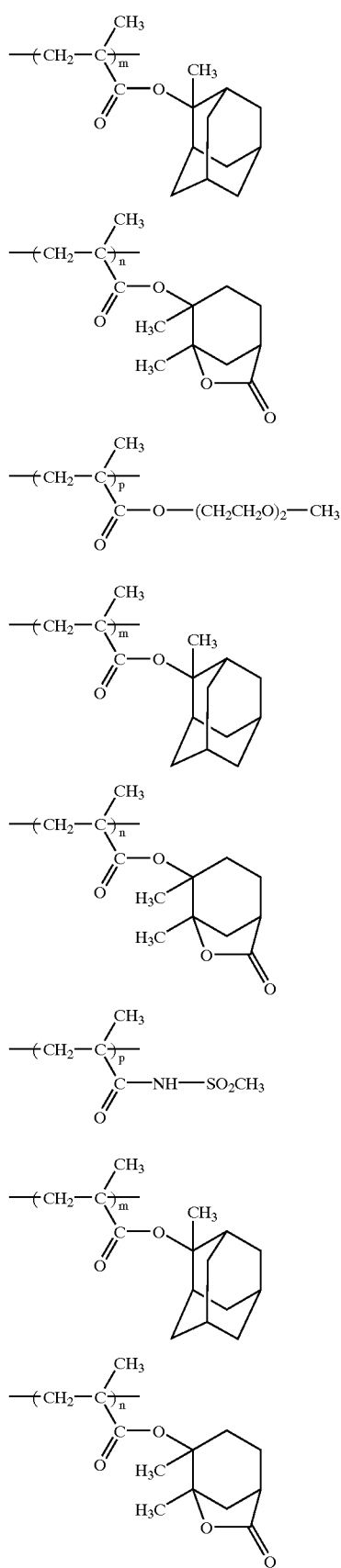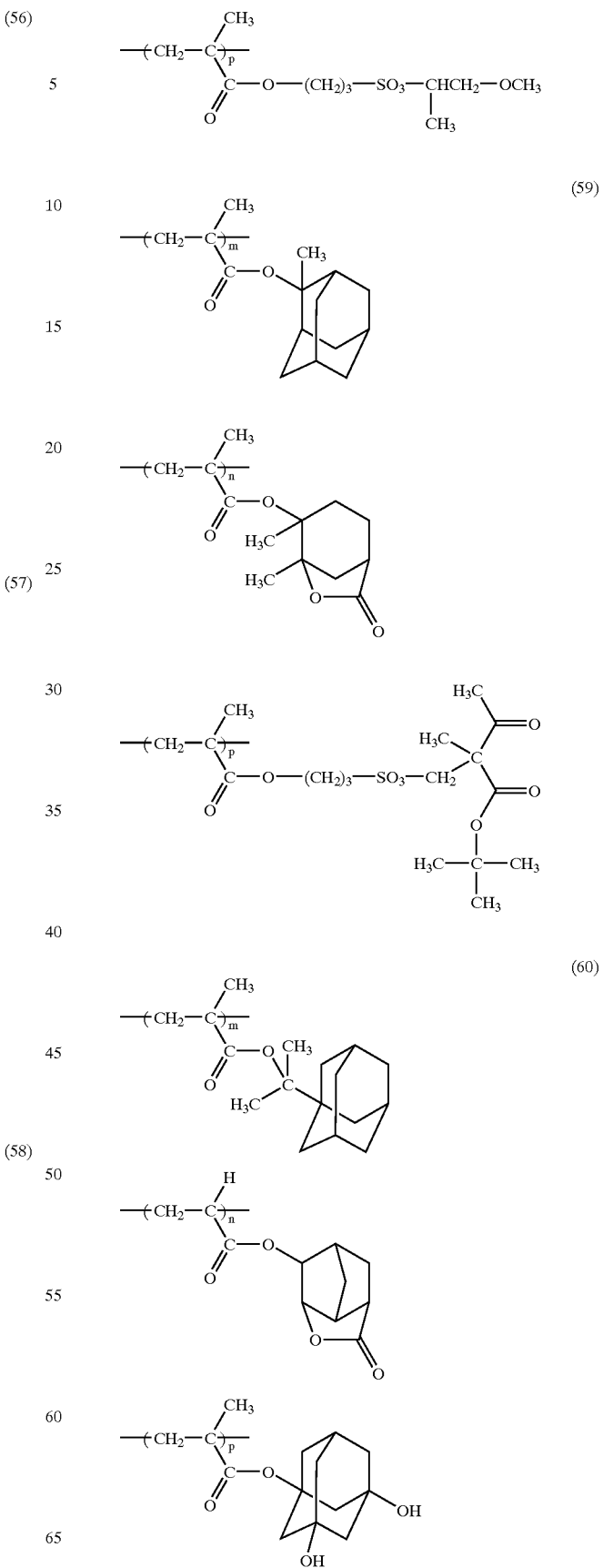

-continued (61)

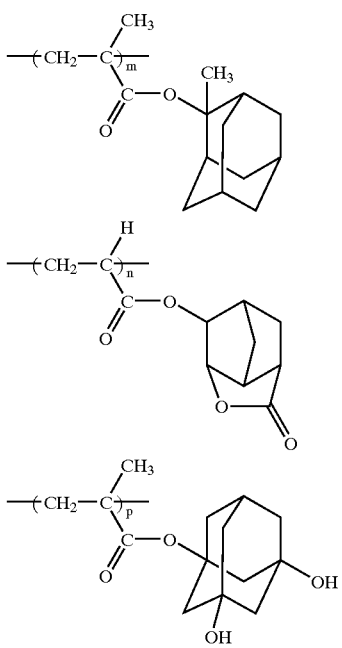

In the above formulae, m, n, p, n1, n2 and n3 each represents the molar ratio of each repeating number. The molar ratio of the repeating unit having a group represented by formula (I-1), (I-2), (I-3) or (I-4) is shown by n, and when two or more repeating units are combined, the molar ratios are shown by n1, n2, etc. The repeating unit having a group containing an alicyclic hydrocarbon structure represented by formula (pI), (pII), (pIII), (pIV), (pV) or (pVI) is shown by m. The repeating unit represented by formula (III-a), (III-b), (III-c) or (III-d) is shown by p.

When the repeating unit represented by formula (III-a), (III-b), (III-c) or (III-d) is contained, m/n/p is (25 to 70)/(25–65)/(3–40), and when the repeating unit represented by formula (III-a), (III-b), (III-c) or (III-d) is not contained, m/n is (30 to 70)/(70 to 30). The copolymer may be a block copolymer or a random copolymer, may be a regular copolymer or an irregular copolymer.

In the positive photoresist composition according to the present invention, the proportion of resin (B) in the entire composition is preferably from 40 to 99.99 wt % based on the entire solid content of the resist, more preferably from 50 to 99.97 wt %.

The positive photoresist composition according to the present invention can further contain, if necessary, an acid-decomposable dissolution-inhibiting compound, a dye, a plasticizer, a surfactant, a photosensitizer, an organic basic compound, and a compound capable of accelerating the solubility in a developing solution.

It is preferred for the positive photoresist composition according to the present invention to contain (C) an acid diffusion inhibitor for the purpose of inhibiting the fluctuation of sensitivity and definition due to aging during the time from exposure to heating and development. Acid diffusion inhibitor (C) is preferably an organic basic compound. As the organic basic compound, a nitrogen-containing basic compound represented by the following formula can be exemplified.

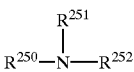
(A)

wherein $R^{250}$, $R^{251}$ and $R^{252}$, which may be the same or different, each represents a hydrogen atom, an alkyl group having from 1 to 12 carbon atoms, an aminoalkyl group having from 1 to 12 carbon atoms, a hydroxyalkyl group having from 1 to 12 carbon atoms, an alkoxyalkyl group having from 1 to 12 carbon atoms, an alkoxyalkoxyalkyl group having from 1 to 12 carbon atoms, or a substituted or unsubstituted aryl group having from 6 to 20 carbon atoms, which may further be substituted.

$R^{251}$ and $R^{252}$ may be bonded to each other to form a ring.

(B)

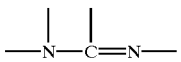

(C)

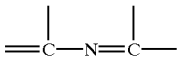

(D)

(E)

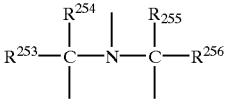

wherein $R^{253}$, $R^{254}$, $R^{255}$ and $R^{256}$, which may be the same or different, each represents an alkyl group having from 1 to 6 carbon atoms.

More preferred organic basic compounds are nitrogen-containing organic basic compounds having two or more nitrogen atoms different in chemical environments in one molecule, and particularly preferred compounds are compounds containing both a substituted or unsubstituted amino group and a ring structure containing a nitrogen atom, or compounds having an alkylamino group. The preferred specific examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. The examples of the preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group, and a cyano group.

The specific examples of the preferred nitrogen-containing basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]nona-5-ene, 1,8-diazabicyclo[5.4.0] undeca-7-ene, 2,4,5-triphenylimidazole, methoxyethoxyethylamine, N-methylmorpholine, N-ethylmorpholine, N-hydroxyethylmorpholine, N-benzylmorpholine, a tertiary morpholine derivative, e.g., cyclohexylmorpholinoethylthiourea (CHMETU), and hindered amines as disclosed in JP-A-11-52575 (e.g., those disclosed in paragraph [0005] of the same patent), but the present invention is not limited to these compounds.

The particularly preferred specific examples include 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-piperidyl)sebacate.

The particularly preferred compounds above all are 1,5-diazabicyclo[4.3.0]nona-5-ene, 1,8-diazabicyclo[5.4.0]-undeca-7-ene, 1,4-diazabicyclo[2.2.2]octane, 4-dimethylaminopyridine, hexamethylenetetramine, CHMETU, and bis(1,2,2,6,6-pentamethyl-4-piperidyl) sebacate.

The nitrogen-containing basic compound is used alone or used in combination of two or more. The addition amount of the nitrogen-containing basic compound is generally from 0.001 to 10 wt % of the solid content of the entire composition of the photosensitive resin composition, preferably from 0.01 to 5 wt %. If the amount is less than 0.001 wt %, the effect of addition of the nitrogen-containing basic compound cannot be obtained. On the other hand, when the addition amount exceeds 10 wt %, the sensitivity lowers and the developing property of an unexposed area is liable to deteriorate.

The positive photoresist composition of the present invention may contain (D) a fluorine- and/or silicon-containing surfactant.

The positive photoresist composition according to the present invention can contain any one, or two, or more, of a fluorine-containing surfactant, a silicon-containing surfactant, and a surfactant containing both a fluorine atom and a silicon atom.

These surfactants are disclosed, e.g., in JP-A-62-36663, JP-A-61-226746, JP-A-61-227645, JP-A-62-170950, JP-A-63-34540, JP-A-7-320165, JP-A-8-62834, JP-A-9-54432, and JP-A-9-5988. The following described commercially available surfactants can also be used.

As the commercially available surfactants which can be used in the present invention, fluorine-based surfactants and silicon-based surfactants, e.g., Eftop EF301 and EF303 (manufactured by Shin-Akita Chemical Co., Ltd.), Florad FC430 and FC431 (manufactured by Sumitomo 3M Co., Limited), Megafac F171, F173, F176, F189 and R08 (manufactured by Dainippon Chemicals and Ink, Co., Ltd.), Sarfron S-382, SC101, SC102, SC103, SC104, SC105 and SC106 (manufactured by Asahi Glass Co., Ltd.), and Troy Sol S-366 (manufactured by Troy Chemical Inc.) can be exemplified. Polysiloxane polymer KP-341 (manufactured by Shin-Etsu Chemical Co., Ltd.) can also be used as the silicon-based surfactant.

The proportion of surfactants is generally from 0.001 to 2 wt % based on the solid content in the composition, preferably from 0.01 to 1 wt %. Surfactants may be used alone or two or more may be used in combination.

The specific examples of other surfactants which can be used in the present invention include nonionic surfactants such as polyoxyethylene alkyl ethers (e.g., polyoxyethylene lauryl ether, polyoxyethylene stearyl ether, polyoxyethylene cetyl ether and polyoxyethylene oleyl ether), polyoxyethylene alkylaryl ethers (e.g., polyoxyethylene octylphenol ether and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate).

The proportion of these other surfactant is generally 2 weight parts or less per 100 weight parts of the solid content in the composition of the present invention, preferably 1 weight part or less.

Each component of the positive photoresist composition according to the present invention is dissolved in a solvent to prepare a coating solution and coated on a support. The examples of the solvents preferably used in the present invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxy propionate, ethyl ethoxy propionate, methyl pyruvate, ethyl pyruvate, propyl pyruvate, N,N-dimethylformamide, dimethyl sulfoxide, N-methylpyrrolidone, and tetrahydrofuran. These solvents can be used alone or in combination of two or more.

Of the above solvents, preferred solvents are 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxy propionate, ethyl ethoxy propionate, N-methylpyrrolidone and tetrahydrofuran.

The positive photoresist composition of the present invention is coated on a substrate to form a thin film. The thickness of the film is preferably from 0.2 to 1.2 μm. If necessary, commercially available inorganic or organic anti-reflection coatings can be used in the present invention.

As the anti-reflection coating, inorganic coating types, e.g., titanium, titanium dioxide, titanium nitride, chromium oxide, carbon, and α-silicon, and organic coating types comprised of a light-absorbing agent and a polymer material can be used. The former requires a film-forming apparatus, such as a vacuum deposition apparatus, a CVD apparatus or a sputtering apparatus. As the organic anti-reflection coating, e.g., an anti-reflection coating comprising the condensation product of a diphenylamine derivative and a formaldehyde-modified melamine resin, an alkali-soluble resin and a light-absorbing agent disclosed in JP-B-7-69611 (the term "JP-B" as used herein means an "examined Japanese patent publication"), a reaction product comprising a maleic anhydride copolymer and a diamine type light-absorbing agent disclosed in U.S. Pat. No. 5,294,680, a anti-reflection coating containing a resin binder and a methylolmelamine-based crosslinking agent disclosed in JP-A-6-118631, an acrylate resin-type anti-reflection coating having a carboxylic acid group, an epoxy group and a light-absorbing group in the same molecule disclosed in JP-A-6-118656, an anti-reflection coating comprising a methylolmelamine and a benzophenone-based light-absorbing agent disclosed in JP-A-8-87115, and an anti-reflection coating comprising a polyvinyl alcohol resin and a low molecular weight light-absorbing agent disclosed in JP-A-8-179509 can be exemplified.

Further, DUV-30 series and DUV-40 series manufactured by Brewer Science Co., and AC-2 and AC-3 manufactured by Chypre Co. can be used as the organic anti-reflection coating.

After coating the above resist coating solution on such a substrate as used in the production of a precision integrated circuit element (e.g., silicon/silicon dioxide coating) (or the above substrate is provided with an anti-reflection coating, if necessary) by an appropriate coating method with a spinner or a coater, the coated film is subjected to exposure through a prescribed mask, baking and development, thereby a good resist pattern can be obtained. The lights for exposure are preferably lights having the wavelengths of from 150 nm to 250 nm. Specifically, a KrF excimer laser (248 nm), an ArF excimer laser (193 nm), an $F_2$ excimer laser (157 nm), an X-ray, an electron beam, etc., can be exemplified.

As the developer (developing solution), an alkaline aqueous solution, such as inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

Further, an appropriate amount of alcohols and surfactants can be added to the above alkaline aqueous solution.

EXAMPLE

The present invention is explained in further detail with reference to the following examples, but the present invention should not be construed as being limited thereto.

Synthesis Example 1

Synthesis of Resin (1) of the Invention

2-Methyl-2-adamantyl methacrylate and 5-exo-methacrylate of 6-endo-hydroxybicyclo[2.2.1]heptane-2-endo-carboxylic acid-γ-lactone were put in a reaction vessel in the ratio of 50/50, and dissolved in 5/5 mixture of N,N-dimethylacetamide/tetrahydrofuran, thereby 100 ml of a solution having a solid content concentration of 20% was prepared. 5-Exo-methacrylate of 6-endo-hydroxybicyclo[2.2.1]-heptane-2-endo-carboxylic acid-γ-lactone synthesized by acetoxy-lactonization of 6-endo-hydroxybicyclo[2.2.1]-heptane-2-endo-carboxylic acid, hydrolysis of the acetoxy group to a hydroxyl group using an alkali, and further esterification with a methacrylic acid chloride (according to the methods described in *J. Chem. Soc.*, 227 (1959), and *Tetrahedron*, 21, 1501 (1965)) was used.

Three mol % of V-65 (manufactured by Wako Pure Chemical Industries Ltd.) was added to the above solution, the solution was dropwise added to 10 ml of N,N-dimethylacetamide heated at 60° C. over 3 hours under a nitrogen atmosphere. After completion of the addition, the reaction solution was heated for 3 hours, 1 mol % of V-65 was added to the reaction solution again and the solution was stirred for 3 hours. After termination of the reaction, the reaction solution was cooled to room temperature, crystallized in 3 liters of distilled water, and the white powder precipitated was recovered. The polymer composition analyzed by $C^{13}$NMR was 51/49. The weight average molecular weight of the resin measured by GPC and calculated in terms of polystyrene standard was 7,200.

Synthesis Example 2 to 12

Synthesis of Resins of the Invention

Resins were prepared in the same manner as in Synthesis Example 1. The composition ratio and the molecular weight of each resin are shown in Table 1 below.

TABLE 1

| Synthesis Example | Resin of Invention (Resin No.) | Composition Ratio (molar ratio) m/n or m/n/p | Molecular Weight |
|---|---|---|---|
| 2 | (5) | 52/48 | 8,400 |
| 3 | (6) | 50/50 | 10,200 |
| 4 | (8) | 52/48 | 8,500 |
| 5 | (17) | 49/51 | 7,600 |
| 6 | (20) | 49/31/20 | 12,500 |
| 7 | (22) | 40/30/30 | 11,000 |
| 8 | (23) | 40/30/30 | 10,500 |
| 9 | (28) | 51/28/21 | 9,700 |
| 10 | (38) | 47/45/8 | 8,900 |
| 11 | (45) | 46/44/10 | 9,300 |
| 12 | (54) | 50/43/7 | 7,100 |
| 13 | (60) | 30/20/50 | 11,000 |
| 14 | (61) | 40/20/40 | 10,000 |

Examples 1 to 18 and Comparative Examples 1 and 2

Preparation and Evaluation of Photosensitive Composition

Each of the resins prepared in the above synthesis example and each component shown in Table 2 below were dissolved in the solvent shown in Table 2 in solid content of 14 wt %, the solution was filtered through a micro filter having a pore diameter of 0.1 μm, to thereby prepare positive resists in Examples 1 to 18 and Comparative Examples 1 and 2.

The components used are shown in Table 2.

TABLE 2

| Example No. | Acid Generating Agent (A1) (g) | Acid Generating Agent (A2) (g) | Resin (10 g) | Base (g) | Surfactant (0.02 g) | Solvent |
|---|---|---|---|---|---|---|
| Example 1 | I-1 (0.1) | A2-1-14 (0.2) | (1) | B1 (0.05) | W-1 | PGMEA |
| Example 2 | I-8 (0.2) | A2-1-17 (0.1) | (5) | B2 (0.02) | W-4 | PGMEA |
| Example 3 | I-1 (0.1) | A2-1-18 (0.3) | (6) | B3 (0.04) | W-2 | PGMEA |
| Example 4 | I-12 (0.2) | A2-1-14 (0.2) | (8) | B4 (0.005) | W-1 | PGMEA |
| Example 5 | I-5 (0.15) | A2-1-17 (0.1) | (17) | B5 (0.01) | W-4 | PGMEA |
| Example 6 | I-11 (0.2) | A2-1-18 (0.1) | (20) | B1 (0.05) | W-1 | PGMEA/PGME (8/2) |
| Example 7 | III-1 (0.3) | A2-2-3 (0.3) | (28) | B2 (0.02) | W-2 | CH |
| Example 8 | III-2 (0.1) | A2-2-3 (0.2) | (38) | B3 (0.04) | W-3 | BL |
| Example 9 | III-3 (0.2) | A2-2-5 (0.1) | (45) | B4 (0.005) | W-1 | PGMEA/BL (9/1) |
| Example 10 | III-11 (0.5) | A2-2-3 (0.1) | (54) | B6 (0.01) | W-4 | PGMEA |
| Example 11 | III-18 (0.3) | A2-1-14 (0.1) A2-2-3 (0.1) | (23) | B1 (0.01) | W-2 | PGMEA/PGME (8/2) |
| Example 12 | II-8 (1) | A2-1-14 (0.1) A2-2-3 (0.1) | (22) | B2 (0.02) | W-1 | PGMEA/PGME (8/2) |
| Example 13 | I-1 (0.1) II-11 (0.3) | A2-1-17 (0.2) | (23) | B1 (0.05) | W-4 | PGMEA |
| Example 14 | I-8 (0.2) II-12 (0.1) | A2-1-17 (0.3) | (22) | B2 (0.02) | W-3 | PGMEA |
| Example 15 | I-1 (0.1) II-17 (0.2) | A2-1-18 (0.4) | (20) | B3 (0.04) | W-1 | PGMEA |
| Example 16 | III-1 (0.3) II-12 (0.5) | A2-2-3 (0.3) | (23) | B4 (0.005) | W-4 | PGMEA |
| Example 17 | III-3 (0.2) II-19 (0.2) | A2-2-3 (0.2) | (22) | B5 (0.01) | W-2 | PGMEA |
| Example 18 | I-11 (0.15) II-10 (0.5) III-1 (0.3) | A2-2-5 (0.1) | (20) | B1 (0.03) | W-1 | PGMEA |
| Example 19 | I-2 (0.4) | A2-2-3 (0.3) | (60) | B1 (0.01) | W-1 | PGMEA/PGME (6/4) |
| Example 20 | I-2 (0.3) III-1 (0.2) | A2-2-3 (0.3) | (61) | B1 (0.01) | W-1 | PGMEA/PGME (6/4) |
| Comparative Example 1 | I-1 (0.1) | None | (1) | B1 (0.05) | W-1 | PGMEA |
| Comparative Example 2 | None | A2-2-3 (0.2) | (1) | B1 (0.05) | W-1 | PGMEA |

The abbreviations in TABLE 2 are as follows.
Acid diffusion inhibitor
B1: DBN: 1,5-Diazabicyclo[4.3.0]nona-5-ene
B2: TPI: 2,4,5-Triphenylimidazole
B3: DCMA: Dicyclohexylmethylamine
B4: 2,6-Diisopropylaniline
B5: TPSA: Triphenylsulfonium acetate
B6: Trimethoxyethoxyethylamine
Surfactant
W-1: Megafac F176 (manufactured by Dainippon Chemicals and Ink Co., Ltd., fluorine-based)
W-2: Megafac R08 (manufactured by Dainippon Ink & Chemicals, Co., Ltd., fluorine-based and silicon-based)
W-3: Polysiloxane polymer KP-341 (manufactured by Shin-Etsu Chemical Co., Ltd.)
W-4: Troy Sol S-366 (manufactured by Troy Chemical Inc., fluorine-based)
Solvent
PGMEA: Propylene glycol monomethyl ether acetate
PGME: Propylene glycol monomethyl ether
CH: Cyclohexanone
BL: γ-Butyrolactone Evaluation Test The positive photoresist solution prepared was coated on a silicon wafer with a spin coater. The coated sample was dried at 130° C. for 90 seconds, to thereby prepare a positive photoresist film having a thickness of about 0.4 μm. Each resist was subjected to exposure with an ArF excimer laser using an ArF stepper (wavelength 193 nm, NA 0.6, manufactured by ISI Co.), heat treatment after exposure at 120° C. for 90 seconds, and then to development with a 2.38 wt % tetramethylammonium hydroxide aqueous solution, rinsing with distilled water, thus resist pattern profile was obtained.

The resist pattern of the thus-obtained silicon wafer was observed with a scanning electron microscope and evaluated as follows.

Sensitivity

Sensitivity was evaluated by minimum exposure amount required for reproducing line-and-space pattern of 0.15 μm.

Definition

Definition was evaluated by limiting definition capable of reproducing line-and-space pattern of 0.15 μm by a minimum exposure amount.

Development Defect

The photosensitive composition was uniformly coated with a spin coater on a silicon substrate having been treated with hexamethyl disilazane, the substrate was heated on a hot plate at 120° C. for 90 seconds and dried, thereby a resist film having a thickness of 0.50 μm was obtained. The resist film was subjected to exposure through a mask with an ArF excimer laser ray, and the resist film was heated on a hot plate immediately after exposure at 110° C. for 90 seconds. Further, the resist was subjected to development with a 2.38 wt % tetramethylammonium hydroxide aqueous solution at 23° C. for 60 seconds, rinsed with pure water for 30 seconds and dried.

The number of development defects of the thus-obtained sample on which a contact hole pattern was formed was measured using KLA2112 (manufactured by KLA Tencor Corporation Japan) (threshold 12, pixel size 0.39).

Side Lobe Resistance

Evaluation of side lobe was performed by resolving a pattern of 0.22 μm to 0.20 μm through a half tone phase shift mask, and observing on pattern of 0.18 μm. Evaluation was performed by the following criteria.

○: Side lobe was not observed at all.
_: Side lobe was observed a little.
x: Side lobe was observed apparently.

The results of evaluation tests are shown in Table 3 below.

TABLE 3

| Example No. | Sensitivity (mj/cm²) | Definition (μm) | Development Defect | Halftone Exposure Aptitude |
|---|---|---|---|---|
| Example 1 | 13 | 0.115 | 8 | ○ |
| Example 2 | 14 | 0.115 | 7 | ○ |
| Example 3 | 12 | 0.120 | 8 | ○ |
| Example 4 | 11 | 0.115 | 6 | ○ |
| Example 5 | 14 | 0.120 | 8 | ○ |
| Example 6 | 13 | 0.120 | 7 | ○ |
| Example 7 | 14 | 0.120 | 8 | ○ |
| Example 8 | 13 | 0.115 | 7 | ○ |
| Example 9 | 14 | 0.115 | 7 | ○ |
| Example 10 | 15 | 0.115 | 7 | ○ |
| Example 11 | 16 | 0.115 | 8 | ○ |
| Example 12 | 14 | 0.120 | 9 | ○ |
| Example 13 | 13 | 0.115 | 7 | ○ |
| Example 14 | 14 | 0.120 | 7 | ○ |
| Example 15 | 15 | 0.115 | 8 | ○ |
| Example 16 | 14 | 0.120 | 7 | ○ |
| Example 17 | 14 | 0.115 | 8 | ○ |
| Example 18 | 13 | 0.115 | 7 | ○ |
| Example 19 | 13 | 0.115 | 5 | ○ |
| Example 20 | 14 | 0.115 | 6 | ○ |
| Comparative Example 1 | 17 | 0.125 | 39 | x |
| Comparative Example 2 | 38 | 0.135 | 37 | x |

As is apparent from the results in Table 3, every positive photoresist composition according to the present invention was on satisfactory level. That is, the positive photoresist composition of the present invention was suited for lithography using far ultraviolet rays including ArF excimer laser exposure.

The present invention can provide a positive photoresist composition which is suitable for far ultraviolet ray exposure, in particular ArF excimer laser exposure, excellent in sensitivity and definition, improved in development defect, and also excellent in halftone exposure aptitude.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A positive photoresist composition comprising:

(A) a compound capable of generating an acid upon irradiation with one of an actinic ray and a radiation, wherein the compound (A) includes:
(A1) a sulfonate compound of a sulfonium; and
(A2) at least one compound of a sulfonate compound of an N-hydroxyimide and a disulfonyldiazomethane compound; and (B) a resin capable of decomposing by the action of an acid to increase the solubility in an alkali developer, wherein the resin (B) contains a repeating unit having a group represented by at least one of formulae (I-1), (I-2), (I-3) and (I-4):

(I-1)

(I-2)

(I-3)

(I-4)

wherein $R_1$, $R_2$, $R_3$, $R_4$ and $R_5$, which may be the same or different, each represents a hydrogen atom, an alkyl group, a cycloalkyl group, or an alkenyl group; and two of $R_1$, $R_2$, $R_3$, $R_4$ and $R_5$ may be bonded to form a ring.

2. The positive photoresist composition as claimed in claim 1, wherein the resin (B) further contains a repeating unit having an alkali-soluble group protected by at least one of groups containing an alicyclic hydrocarbon structure, which are represented by formula (pI), (pII), (pIII), (pIV), (pV) or (pVI)

(pI)

-continued

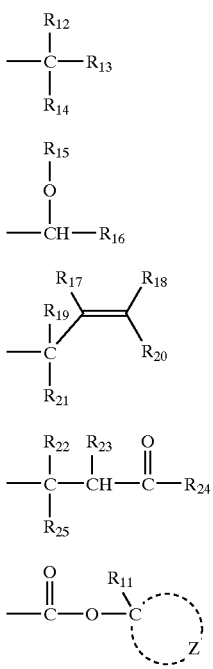

(pII)

(pIII)

(pIV)

(pV)

(pVI)

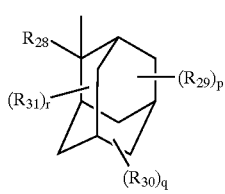

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the carbon atom; $R_{12}$, $R_{13}$, $R_{14}$, $R_{15}$ and $R_{16}$ each represents a straight chain or branched alkyl group having from 1 to 4 carbon atoms, or an alicyclic hydrocarbon group, and at least one of $R_{12}$, $R_{13}$ and $R_{14}$, or at least one of $R_{15}$ and $R_{16}$ represents an alicyclic hydrocarbon group; $R_{17}$, $R_{18}$, $R_{19}$, $R_{20}$ and $R_{21}$ each represents a hydrogen atom, a straight chain or branched alkyl group having from 1 to 4 carbon atoms, or an alicyclic hydrocarbon group, and at least one of $R_{17}$, $R_{18}$, $R_{19}$, $R_{20}$ and $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each represents a straight chain or branched alkyl group having from 1 to 4 carbon atoms, or an alicyclic hydrocarbon group, and at least one of $R_{22}$, $R_{23}$, $R_{24}$ and $R_{25}$ represents an alicyclic hydrocarbon group.

3. The positive photoresist composition as claimed in claim 2, wherein the group represented by formulae (pI) to (pVI) is represented by formula (II):

(II)

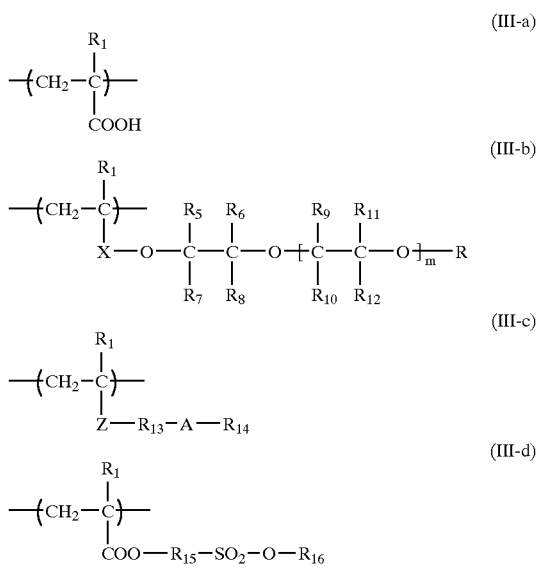

wherein $R_{28}$ represents an alkyl group; $R_{29}$, $R_{30}$ and $R_{31}$, which may be the same or different, each represents a hydroxyl group, a halogen atom, a carboxyl group, or an alkyl, cycloalkyl, alkenyl, alkoxyl, alkoxycarbonyl or acyl group; p, q and r each represents 0 or an integer of from 1 to 3.

4. The positive photoresist composition as claimed in claim 1, wherein the resin (B) further contains a repeating unit represented by formula (a):

(a)

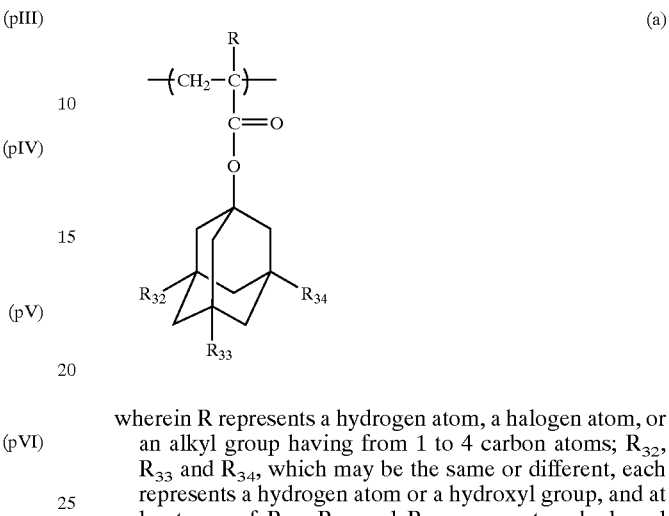

wherein R represents a hydrogen atom, a halogen atom, or an alkyl group having from 1 to 4 carbon atoms; $R_{32}$, $R_{33}$ and $R_{34}$, which may be the same or different, each represents a hydrogen atom or a hydroxyl group, and at least one of $R_{32}$, $R_{33}$ and $R_{34}$ represents a hydroxyl group.

5. The positive photoresist composition as claimed in claim 1, wherein the resin (B) further contains at least one of repeating units represented by formulae (III-a) to (III-d):

(III-a)

(III-b)

(III-c)

(III-d)

wherein $R_1$ represents a hydrogen atom, a halogen atom, an alkyl group having 1 to 4 carbon atoms; $R_5$ to $R_{12}$ each independently represents a hydrogen atom or an alkyl group; R represents a hydrogen atom, an alkyl, cycloalkyl, aryl or aralkyl group; m represents an integer of 1 to 10; X represents a single bond, an alkylene group, a cycloalkylene group, an arylene group, an ether group, a thioether group, a carbonyl group, an ester group, an amide group, a sulfonamide group, an urethane group, an urea group, or a divalent group which is not decomposed by the action of an acid, and which is a divalent group resulting from the combination of at least two groups selected from the group consisting of an alkylene group, a cycloalkylene group, an arylene group, an ether group, a thioether group, a carbonyl group, an ester group, an amide group, a sulfonamide group, an urethane group and an urea group; Z represents a single bond, an ether group, an ester group, an amide group, an alkylene group, or a divalent group resulting from the combination of at least two group of an ether group, an ester group, an amide group and an alkylene group; $R_{13}$ represents a single bond, an alkylene group, an arylene group, or a divalent group resulting from the combination of an alkylene group and an arylene group; $R_{15}$ represents an alkylene group, an arylene group, or a divalent group resulting from the combination of an alkylene group and an arylene group; $R_{14}$ represents an alkyl, cycloalkyl, aryl or aralkyl group; $R_{16}$ represents a hydrogen atom, an alkyl, cycloalkyl, alkenyl, aryl or aralkyl group; A represents one of the following functional groups:

—CO—NH—SO$_2$—
—SO$_2$—NH—CO—
—NH—CO—NH—SO$_2$—
—SO$_2$—NH—CO—NH—
—O—CO—NH—SO$_2$—
—SO$_2$—NH—CO—O—
—SO$_2$—NH—SO$_2$—

6. The positive photoresist composition as claimed in claim 1, wherein the resin (B) contains the repeating unit having at least one of groups represented by formulae (I-1) to (I-4) in an amount of 30 to 70 mol %, base on the total repeating units.

7. The positive photoresist composition as claimed in claim 2, wherein the resin (B) contains the repeating unit containing an alkali-soluble group protected by at least one of groups represented by formulae (pI) to (pVI) in an amount of 20 to 75 mol %, based on the total repeating units.

8. The positive photoresist composition as claimed in claim 4, wherein the resin (B) contains the repeating unit represented by formula (a) in an amount of 10 to 40 mol %, based on the total repeating units.

9. The positive photoresist composition as claimed in claim 5, wherein the resin (B) contains the repeating unit represented by formulae (III-a) to (III-d) in an amount of 0.1 to 30 mol %, based on the total repeating units.

10. The positive photoresist composition as claimed in claim 1, wherein the compound (A) includes the compound (A1) in an amount of 5 to 96% by weight, based on the total content of the compound (A).

11. The positive photoresist composition as claimed in claim 1, wherein the compound (A) includes the compound (A2) in an amount of 5 to 96% by weight, based on the total content of the compound (A).

12. The positive photoresist composition as claimed in claim 1, wherein the compound (A1) comprises at least one compound selected from the group consisting of a sulfonium salt compound not having an aromatic ring, a triarylsulfonium salt compound, and a compound having a phenacyl-sulfonium salt structure, each of which is capable of generating an acid upon irradiation with one of an actinic ray and a radiation.

13. The positive photoresist composition as claimed in claim 1, which further comprises (C) an acid diffusion inhibitor.

14. The positive photoresist composition as claimed in claim 1, which further comprises (D) a surfactant containing at least one of a fluorine atom and a silicon atom.

15. The positive photoresist composition as claimed in claim 1, which comprises the compound (A) in an amount of 0.001 to 40% by weight, based on the total solid content of the composition.

16. The positive photoresist composition as claimed in claim 1, which comprises the resin (B) in an amount of 40 to 99.99% by weight, based on the total solid content of the composition.

17. The positive photoresist composition as claimed in claim 1, wherein the content ratio by weight of the compound (A1) to the compound (A2):(A1)/(A2) is 5/95 to 95/5.

18. The positive photoresist composition as claimed in claim 1, which is a positive photoresist composition to be irradiated with a far ultraviolet ray of the wavelength of from 150 to 220 nm as an exposure light source.

* * * * *